(12) United States Patent
Shinada et al.

(10) Patent No.: US 7,026,830 B2
(45) Date of Patent: Apr. 11, 2006

(54) METHOD AND APPARATUS FOR INSPECTING INTEGRATED CIRCUIT PATTERN

(75) Inventors: Hiroyuki Shinada, Chofu (JP); Mari Nozoe, Ome (JP); Haruo Yoda, Tokyo (JP); Kimiaki Ando, Hamura (JP); Katsuhiro Kuroda, Hachioji (JP); Yutaka Kaneko, Hachioji (JP); Maki Tanaka, Yokohama (JP); Shunji Maeda, Yokohama (JP); Hitoshi Kubota, Fujisawa (JP); Aritoshi Sugimoto, Tokyo (JP); Katsuya Sugiyama, Kashiwa (JP); Atsuko Takafuji, Tokyo (JP); Yusuke Yajima, Kodaira (JP); Hiroshi Tooyama, Hachioji (JP); Tadao Ino, Hino (JP); Takashi Hiroi, Yokohama (JP); Kazushi Yoshimura, Kamakura (JP); Yasutsugu Usami, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 54 days.

(21) Appl. No.: 10/379,555

(22) Filed: Mar. 6, 2003

(65) Prior Publication Data
US 2003/0169060 A1    Sep. 11, 2003

Related U.S. Application Data

(63) Continuation of application No. 09/983,703, filed on Oct. 25, 2001, now Pat. No. 6,559,663, which is a continuation of application No. 09/525,341, filed on Mar. 14, 2000, now Pat. No. 6,329,826, which is a continuation of application No. 08/811,511, filed on Mar. 14, 1997, now Pat. No. 6,172,363.

(30) Foreign Application Priority Data

| Mar. 5, 1996 | (JP) | ................... 08-075243 |
| Jun. 4, 1996 | (JP) | ................... 08-141341 |
| Nov. 21, 1996 | (JP) | ................... 08-310378 |
| Feb. 18, 1997 | (JP) | ................... 09-033476 |

(51) Int. Cl.
  *G01R 31/305* (2006.01)
  *G01R 31/28* (2006.01)

(52) U.S. Cl. .................... 324/751; 324/765

(58) Field of Classification Search ............... 324/751, 324/750, 500, 501, 765; 250/311
See application file for complete search history.

(56) References Cited

U.S. PATENT DOCUMENTS 3,628,014 A * 12/1971 Grubic, Jr. .................. 250/310

(Continued)

FOREIGN PATENT DOCUMENTS

JP    07-078854    3/1995

(Continued)

OTHER PUBLICATIONS

U.S Appl. No. 07/710,351, May 30, 1991.

*Primary Examiner*—Ernest Karlsen
(74) *Attorney, Agent, or Firm*—Mattingly, Stanger, Malur & Brundidge, P.C.

(57) ABSTRACT

To make possible the in-line inspection of a pattern of an insulating material.

A patterned wafer 40 formed with a pattern by a resist film is placed on a specimen table 21 of a patterned wafer inspection apparatus 1 in opposed relation to a SEM 3. An electron beam 10 of a large current is emitted from an electron gun 11 and the pattern of the patterned wafer is scanned only once at a high scanning rate. The secondary electrons generated by this scanning from the patterned wafer are detected by a secondary electron detector 16 thereby to acquire an electron beam image. Using this electron beam image, the comparative inspection is conducted on the patterned wafer through an arithmetic operation unit 32 and a defect determining unit 33.

Since an electron beam image of high contrast can be obtained by scanning an electron beam only once, a patterned wafer inspection method using a SEM can be implemented in the IC fabrication method.

6 Claims, 17 Drawing Sheets

U.S. PATENT DOCUMENTS

| | | | |
|---|---|---|---|
| 4,644,172 A * | 2/1987 | Sandland et al. | 250/548 |
| 4,978,908 A * | 12/1990 | Mahant-Shetti et al. | 324/751 |
| 5,006,795 A | 4/1991 | Yoshizawa et al. | |
| 5,404,110 A | 4/1995 | Golladay | |
| 5,502,306 A | 3/1996 | Meisburger et al. | |
| 5,528,156 A | 6/1996 | Ueda et al. | |
| 5,537,669 A * | 7/1996 | Evans et al. | 382/141 |
| 5,548,211 A | 8/1996 | Tujide et al. | |
| 5,592,100 A | 1/1997 | Shida et al. | |
| 5,594,245 A | 1/1997 | Todokoro et al. | |
| 5,614,713 A | 3/1997 | Kobaru et al. | |
| 5,614,833 A | 3/1997 | Golladay | |
| 5,633,595 A * | 5/1997 | Ueda et al. | 324/751 |
| 5,640,098 A | 6/1997 | Niijima et al. | |
| 5,659,172 A | 8/1997 | Wagner et al. | |
| 5,757,198 A | 5/1998 | Shida et al. | |
| 5,821,761 A * | 10/1998 | Shida et al. | 324/751 |
| 5,834,774 A | 11/1998 | Negishi et al. | |
| 6,091,249 A | 7/2000 | Talbot et al. | |
| 6,636,064 B1 * | 10/2003 | Satya et al. | 324/763 |
| 6,642,726 B1 * | 11/2003 | Weiner et al. | 324/751 |
| 6,703,850 B1 * | 3/2004 | Nozoe et al. | 324/751 |
| 6,774,646 B1 * | 8/2004 | Han et al. | 324/751 |

FOREIGN PATENT DOCUMENTS

| | | |
|---|---|---|
| JP | 08-068772 | 3/1996 |
| JP | 08-088258 | 4/1996 |

\* cited by examiner

NORMALLY PROCESSED PATTERN

FAILURE-GENARATED PATTERN

A: ISOLATED DEFECT
B: PROJECTION
C: SHORT-CIRCUITING
D: LACK
E: BREAKING
F: THIN-FILM REMAIN
G: OPENING FAILURE

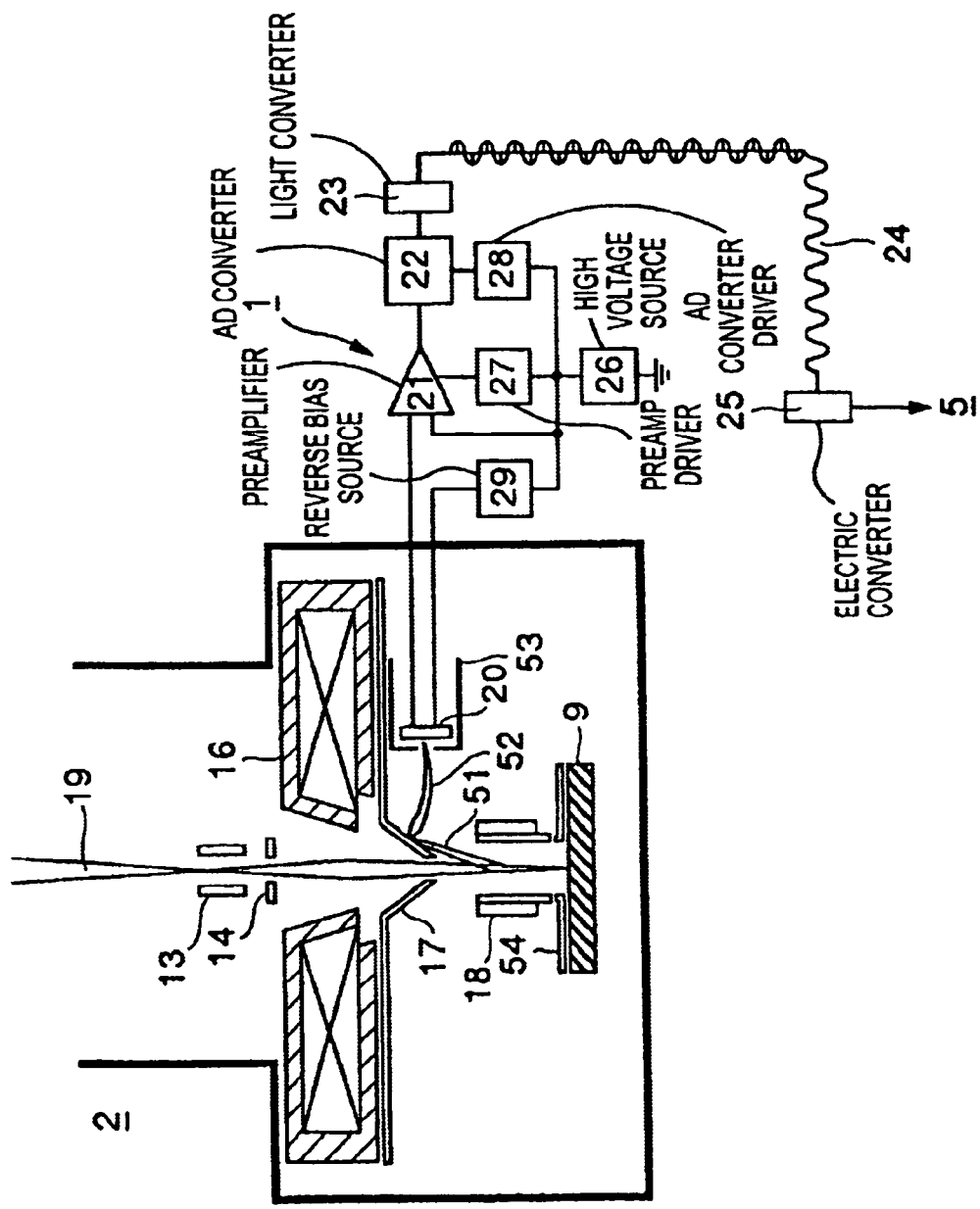

ELECTRON BEAM PASS THROUGH, OPENING

METHOD AND APPARATUS FOR INSPECTING INTEGRATED CIRCUIT PATTERN

This is a continuation application of U.S. Ser. No. 09/983,703, now U.S. Pat. No. 6,559,663, filed Oct. 25, 2001; which is a continuation application of U.S. Ser. No. 09/525,341, filed Mar. 14, 2000, now U.S. Pat. No. 6,329,826; which is a continuation application of U.S. Ser. No. 08/811,511, filed Mar. 4, 1997, now U.S. Pat. No. 6,172,363.

BACKGROUND OF THE INVENTION

The present invention relates to a method and apparatus for producing a substrate having a micro circuit pattern for a semiconductor device, a liquid crystal, or the like, and particularly relates to a technique for inspecting a pattern for a semiconductor device or a photomask, that is, the present invention relates to a technique for inspecting a pattern on a wafer in a way of semiconductor device producing process and a technique for performing comparison and inspection by using an electron beam.

Inspection of a semiconductor wafer will be described as an example.

A semiconductor device is produced by repeating a process of transferring, by lithographing and etching, a pattern formed in a photomask onto a semiconductor wafer. In a semiconductor device producing process, the state of lithographing, etching, or the like, generation of particles, and so on, exert a large influence on the yield of the semiconductor device. Accordingly, in order to detect occurrence of abnormality or failure in an early stage or preparatorily, conventionally, a method of inspecting a pattern on a semiconductor wafer is carried out in a way of producing process.

As for a method of inspecting a defect existing in a pattern on a semiconductor wafer, a defect inspecting apparatus in which white light is irradiated onto a semiconductor wafer so that circuit patterns of the same kind in a plurality of LSIs are compared with each other by using an optical image, has been put into practice. The outline of the inspecting method has been described in "Monthly Semiconductor World", August issue, pp. 96–99, 1995. Further, as a inspecting method using an optical image, a method in which an optically illuminated region on a substrate is formed as an image by means of a time-delay integrating sensor so that the characteristic of the image is compared with designed characteristic inputted in advance to thereby detect a defect, has been disclosed in JP-A-3-167456 or a method in which the deterioration of an image at the time of acquisition of the image is monitored so that the deterioration of the image is corrected at the time of detection of the image to thereby perform comparison and inspection in a stabler optical image, has been disclosed in JP-B-6-58220. If a semiconductor wafer in a way of producing process was inspected by such an optical inspection method, the pattern residue or defect having a light-transmissible silicon oxide film or a photoresist material on its surface could not be detected. Further, an etching remainder or a incomplete-open failure in a micro conduct hole smaller than the resolution of an optical system could not be detected. Further, a defect generated in a wiring-pattern stepped bottom portion could not be detected.

As described above, with the advance of reduction in size of the circuit pattern and complication in shape of the circuit pattern and with the advance of diversification of the material, it has become difficult to detect a defect by using an optical image. Therefore, a method for comparing and inspecting a circuit pattern by using an electron beam image having higher resolution than that of the optical image has been proposed. When a circuit pattern is compared and inspected by means of an electron beam image, in order to obtain a practical inspection time, the image needs to be acquired at a very high speed in comparison with observation by using a scanning electron microscopy (hereinafter abbreviated to SEM). Further, it is necessary to secure resolution and an SN ratio in the image acquired at a high speed.

As a pattern comparison and inspection apparatus using an electron beam, a method in which an electron beam with an electron-beam current not smaller than 100 times (10 nA) as large as the current in the general SEM is irradiated onto an electrically conductive substrate (such as an X-ray mask, or the like) to detect any electrons among secondary electrons, reflected electrons and transmitted electrons generated therefrom and compare/inspect an image formed from a signal of the electrons to thereby automatically detect a defect is disclosed in J. Vac. Sci. Tech. B, Vol. 9, No. 6, pp. 3005–3009 (1991), J. Vac. Sci. Tech. B, Vol. 10, No. 6, pp. 2804–2808 (1992), JP-A-5-258703 and U.S. Pat. No. 5,502,306.

Further, as a method for inspecting or observing a circuit substrate having an insulating material by means of an electron beam, a method in which a stabler image is acquired by irradiation of a low-accelerated electron beam not higher than 2 keV in order to reduce the influence of charge has been disclosed in JP-A-59-155941 and "Electron and Ion Beams Handbook" (THE NIKKAN KOGYO SHINBUN, Ltd.), pp. 622–623. Further, a method in which ions are irradiated from the back of a semiconductor substrate has been disclosed in JP-A-2-15546 and a method in which light is irradiated onto a surface of a semiconductor substrate to thereby cancel charge of an insulating material is disclosed in JP-A-6-338280.

Further, in a large-current and low-accelerated electron beam, it is difficult to acquire a high-resolution image because of a space-charge effect. As a measure to solve this problem, a method in which a high-accelerated electron beam is retarded just before a sample so that a substantially low-accelerated electron beam is irradiated onto the sample is disclosed in JP-A-5-258703.

As a method for acquiring an electron-beam image at a high speed, a method in which an image is acquired by continuously irradiating an electron beam onto a semiconductor wafer on a sample stage while continuously moving the sample stage is disclosed in JP-A-59-160948 and JP-A-5-258703. Further, a structure constituted by a scintillator (Al-vapor deposited fluorescent material), a light guide and a photo-multiplier is used as a secondary electron detecting apparatus used conventionally in the SEM. A detecting apparatus of this type is, however, poor in frequency responsibility because light emission from the fluorescent material is detected, so that the detecting apparatus of this type is unsuitable for formation of an electron beam image at a high speed. As a detecting apparatus for detecting a high-frequency secondary electron signal to solve this problem, a detection means using a semiconductor detector is disclosed in JP-A-5-258703.

When a circuit pattern in a process for producing a micro-structure semiconductor device was detected by using the aforementioned prior art optical inspection method, it was possible to detect the residue of a silicon oxide film, a resist material, or the like, which was formed from an optically transmissible material and which was sufficiently short in the optical distance depending on the optical wavelength and refractive index used for inspection, and it was difficult to detect an etching remainder or a incomplete-open failure in a micro conduct hole which was linear so that the width of a short side thereof was not larger than the resolution of an optical system.

On the other hand, in the observation and inspection using the SEM, there are two problems as follows. One problem is that a very long time is required for inspecting a circuit pattern on the whole surface of a semiconductor wafer because the conventional method, by means of the SEM, for forming an electron-beam image needs a very long time. Accordingly, in order to obtain practical throughput in a semiconductor device producing process, or the like, it was necessary to acquire an electron-beam image at a very high speed. It was further necessary to secure the SN ratio of the electron-beam image acquired at a high speed and to keep accuracy in a predetermined value.

The other problem was that it was difficult to obtain a stable contrast image in inspection by means of an electron beam and to obtain a predetermined value of inspection accuracy in the case where the material constituting a circuit pattern as a subject to be inspected was formed from an electrically insulating material such as a resist, a silicon oxide film, or the like, or in the case where the material was formed from a mixture of an electrically insulating material and an electrically conducting material. This is because, when an electron beam is irradiated onto a matter, secondary electrons are generated from the irradiated portion of the material but the matter is charged because the irradiated current value is not equal to the secondary electron current value in the case where the subject to be inspected is an electrically insulating material. When charge occurs, efficiency in generation of secondary electrons from that charged portion and the orbit of secondary electrons after the generation are influenced so that not only the contrast of the image is changed but also the image is distorted without reflection of the actual shape of the circuit pattern. This charge state is sensitive to the condition of electron-beam irradiation, so that if the speed or range of irradiation of the electron beam is changed, an image quite different in contrast is obtained even in one and the same position and even in one and the same circuit pattern.

In order to detect a defect being unable to be detected by an optical inspection method with respect to the prior art, a method in which inspection is carried out by irradiating a narrowed electron beam onto a sample substrate at a high speed is disclosed in JP-A-59-160948 and JP-A-5-258703 as a method for performing comparison and inspection by means of an electron-beam image acquired by irradiating an electron beam onto an electrically conductive substrate. In this conventional technique, however, there is no description about a method for adjusting the inspection condition with respect to a material such as an electrically insulating material, or the like. Further, as another conventional technique, a method in which a primary electron beam to be irradiated onto a sample substrate is retarded to thereby make irradiation energy low-accelerated, for example, not higher than 2 keV, in order to observe a substrate having an electrically insulating material is described in JP-A-59-155941. This conventional technique is, however, a method in which an electron beam is continuously irradiated onto a certain local region so that an image is acquired after the charge of the local region becomes stable. Accordingly, this conventional technique is unsuitable for inspecting a wide region at a high speed because a long time is required for acquiring the electron-beam image. Further, even in the case where charge in the local region is stable, it is difficult that another region to be compared is controlled to be in the same charge state. For example, it is difficult to inspect a wide region of a semiconductor wafer, or the like.

In the case where not only a converged electron beam small in electron-beam current is slowly irradiated onto a sample but also a long time is taken for signal detection as shown in the conventional SEM, a signal detected in a detection time per unit pixel is integrated to form an image signal of the unit pixel so that an SN ratio necessary for comparison and inspection is obtained. Because the state of charge changes with the passage of time correspondingly to the irradiation time as described above, the image signal changes during integration so that it is difficult to obtain stable contrast. The present inventors have found that, as a method for inspecting a circuit substrate having such an electrically insulating material, it is effective for obtaining stable contrast to shorten the secondary electron signal detection time to thereby eliminate the contrast fluctuation due to the aforementioned process such as integration, or the like, and to thereby suppress the influence on the change of charge with the passage of time. Further, the present inventors have found that an electron-beam image of contrast due to the secondary electron generation efficiency of the material of the sample by irradiating a large probe sized electron beam in a range of from about 10 nm to about 50 nm onto a sample at a high speed to acquire an image instantaneously is more suitable than an electron-beam image based on contour information of a shape acquired by an electron beam converged to a range of from 5 nm to 10 nm as shown in the SEM of the conventional technique. As described above, a theme of the present invention is not only to acquire an electron-beam image of contrast generated from a material instantaneously by scanning a large probe sized electron beam at a high speed in comparison with the conventional technique but also to secure the SN ratio or resolution in the electron-beam image sufficiently adapted for image comparison and inspection.

In order to radiate an electron beam at a high speed, detect a signal at a high speed and secure the SN ratio and resolution in the electron-beam image as described above, an electron beam having an electron-beam current larger than that generally used in the SEM needs to be irradiated onto a substrate, to be inspected as described in the prior art. As described in the prior art, with a large-current and low-accelerated electron beam, it is difficult to obtain an image of high resolution because of the space-charge effect. As a method to solve this problem, there is a method in which a high-accelerated electron beam is retarded just before a sample so that a substantially low-accelerated electron beam is irradiated onto the sample. In order to carry out the deceleration of the primary electron beam, a negative voltage for deceleration is required to be applied to a sample substrate, a sample stage, or the like. When the primary electron beam retarded by the negative voltage is irradiated onto the sample substrate, secondary electrons having energy of the order of tens of mV are generated from a surface of the substrate. Because an electric field generated by the negative voltage for deceleration acts on the secondary electrons to accelerate the secondary electrons to energy of the order of kV, it is difficult to collect the high-speed secondary electrons to a detector. As a method for collecting secondary electrons to a detector, there has been proposed, in the prior art, a method using a deflector (hereinafter referred to as E×B deflector) for offsetting the quantities of deflection caused by the electric field and magnetic field acting on the primary electron beam and for deflecting secondary electrons by superposing the quantities of deflection on each other. In the case where the detector is located in a place away from the orbit of the primary electron beam, however, the secondary electrons need to be deflected largely by the aforementioned E×B deflector in order to collect the secondary electrons to the detector. If the quantity of deflection is selected to be too large, there arises a problem that the secondary electrons collide with a deflection plate per se of the E×B deflector so that the secondary electrons cannot be led to the detector. Further, if the deflection by the E×B deflector is selected to be intensive, there arises a problem that aberration occurs in the primary electron beam so that it is difficult to converge the electron beam on a surface of the sample substrate through an objective lens, or the like.

Further, as described in the prior art, in order to form an electron-beam image at a high speed, a detection means using a semiconductor detector is used as a detection apparatus for detecting a high-frequency secondary electron signal. This prior art means comprises a semiconductor detector reversely biased and high in response speed, a preamplifier for amplifying an analog signal detected by the semiconductor detector, and means for light-transmitting the analog signal amplified by the preamplifier. The aforementioned semiconductor detector and the aforementioned preamplifier are floated to a positive high electric potential. In this conventional method, the analog signal detected by the semiconductor detector is transmitted as it is by the light-transmitting means. This light-transmitting means, however, is constituted by a light-emitting element for converting an electric signal into a light signal, an optical fiber cable, and a light-receiving element for converting a light signal into an electric signal. Accordingly, there arises a problem that noise generated from the light-emitting element and the light-receiving element is added to the original analog signal to lower the SN ratio in the secondary electron signal.

SUMMARY OF THE INVENTION

A first object of the present invention is to provide an inspection technique in which a circuit pattern which is hardly detected on the basis of an optical image and is formed from a material having electrically insulating property or a circuit pattern which is formed from a mixture of a material having electrically insulating property and a material having an electrically conducting property can be inspected by using an electron-beam image.

A second object of the present invention is to acquire an electron-beam image as a good-quality image which is high in the speed, good in the stability, high in the resolution, high in the contrast and large in the SN ratio in order to perform inspection by using the aforementioned electron-beam image so that a defect generated on a micro circuit pattern can be detected accurately in comparison and inspection.

A third object of the present invention is to provide a technique in which a large-current relatively large probe sized electron beam is irradiated onto a sample at a high speed and generated secondary electrons are detected instantaneously and efficiently so that an electron-beam image of high contrast generated from the material of the sample is formed in a condition corresponding to the material of the sample to thereby acquire a stable electron-beam image also with respect to the electrically insulating material.

A fourth object of the present invention is to provide means for efficiently detecting secondary electrons generated by irradiation of an electron beam onto a sample or for detecting high-speed high-frequency secondary electrons with a high SN ratio to thereby achieve the aforementioned first, second and third objects.

A fifth object of the present invention is to provide a technique for inspecting a circuit pattern with high accuracy to achieve the aforementioned first through fourth objects, that is, to provide an inspection method in which the inspection is applied to a semiconductor device or other micro circuit patterns so that a result of the inspection is reflected on the condition for producing the semiconductor device, or the like, to thereby bring contribution not only to improvement in reliability of the semiconductor device, or the like, but also to reduction in the level of defectiveness.

A substrate having a micro circuit pattern such as a semiconductor device or the like may be formed not only from an electrically conductive film singly but also from an electrically conductive film and an electrically insulating material. In order to achieve the aforementioned objects for irradiating an electron beam onto a circuit pattern having an electrically insulating material to thereby detect a micro defect on a micro pattern at a high speed, a method and apparatus for inspecting a circuit pattern according to the present invention will be described below.

According to the present inventors' discussion, it has been found that contrast changes largely in accordance with time and position when a large quantity of electron beams are unevenly irradiated onto a local region of a substrate surface containing an electrically insulating material but an electron-beam image of stable contrast can be obtained even in the electrically insulating material when an electron beam having an electric potential substantially equal to that in the periphery of a region to be inspected in the substrate is evenly irradiated onto the sample in the region to be inspected so that secondary electrons generated in a very short time are detected. This is because a signal little in the fluctuation of incidence of secondary electrons with the passage of time can be acquired by detecting secondary electrons instantaneously in a very short time even in a transitional period in which the sample is charged by the irradiation of the electron beam. Further, the present inventors have found that an electron-beam image of contrast generated by the secondary electron generating efficiency in the material of the sample by irradiation of a large probe sized electron beam in a range of from about 50 nm to about 100 nm onto the sample at a high speed to acquire an image instantaneously is more suitable for detection of a defect than an electron-beam image based on contour information of a shape acquired by a converged electron beam in a range of from 5 nm to 10 nm as represented by the SEM in the prior art. The secondary electron generating efficiency varies in accordance with the material of a sub-layer which forms a circuit pattern therein, the material of a surface pattern and the thickness of the film. Accordingly, if an electron-beam image of high contrast in the pattern and the subbing layer is acquired, a defect in the pattern generated by the material or a defect in the sub-layer can be detected easily. The secondary electron generating efficiency in each material constituting the circuit pattern varies in accordance with the condition for irradiation of an electron beam. The secondary electron generating efficiency varies also in accordance with the state of charge. Therefore, if the condition of irradiation or the condition of charge is optimized in accordance with the material so that the contrast due to the surface pattern and the sub-layer material becomes high, an electron-beam image suitable for detection of each defect can be formed in accordance with the combination of materials. To this end, therefore, there are a method in which secondary electrons generated by irradiating an electron beam once are detected in a very short time to thereby form an electron-beam image, and a method in which secondary electrons generated in a state in which the contrast is increased by irradiation of an electron beam several times in accordance with the material are detected in a very short time. Further, it has been found that there are a method in which an electron-beam image is obtained by irradiating an electron beam once or several times at a high speed and detecting secondary electrons in a very short time in a period in which the transitional change of an electric potential due to the charge is little, and a method in which an electron-beam image is obtained by irradiating an electron beam or other charged-particle beam onto a sample substrate in advance in accordance with the combination of materials and detecting secondary electrons in a very short time after the state of charge is stabilized and the contrast becomes high. Because, in any method, an electron beam is irradiated evenly onto a region to be inspected in a state in which the potential of the region to be inspected in the substrate is substantially equal to the potential of the periphery of the region, that is, in a state in which the charge is even, the contrast of the acquired image becomes substantially even between different regions to be inspected. Accordingly, when electron-beam images are compared and inspected, no false detection is caused by the fluctuation of the contrast.

It has been found that a method in which a large-current electron beam is evenly and speedily irradiated onto a substrate to be inspected and a secondary electron signal corresponding to the region of beam irradiation is instantaneously detected simultaneously with the irradiation is effective to achieve the former detection method. Because an electron beam is evenly instantaneously irradiated onto all regions to be inspected at the time of inspection, the potential of the substrate due to the charge is even in that instance. Accordingly, the influence of the transitional change of charge with the passage of time can be avoided when secondary electrons are detected instantaneously in that state. Further, because the ratio of the number of electrons incident to a sample different in accordance with the material, to the number of secondary electrons emitted from the sample can be set to be substantially uniform if the energy of the electron beam irradiated onto the sample is controlled, the contrast can be stabilized and the injury of the sample circuit substrate can be avoided. That is, even in a circuit pattern having an electrically insulating material, an image stable in contrast can be formed. The energy of the electron beam irradiated onto the sample can be controlled because the degree of deceleration can be changed by applying a negative potential to the sample or sample stage to retard the primary electron beam just above the sample and controlling the applied voltage to be variable.

As means for automatically inspecting a defect generated in a surface of a circuit pattern of a semiconductor wafer, or the like, at a high speed, secondary electrons are detected in a real time of the movement of the sample stage to form an image by scanning an electron beam at a high speed in a direction perpendicular to the direction of the movement of the sample stage while continuously moving the sample stage in one direction, and the thus formed image is compared and inspected. In order to achieve this inspection method, an electron beam is irradiated once or several times at a high speed to form an image though the condition for irradiation of the electron beam varies in accordance with the material. The image quality of the electron-beam image adapted for comparison and inspection by irradiation of the electron beam once or several times can be secured by the following four means. The first means is to radiate a high-density electron beam onto a sample to thereby secure an SN ratio in a secondary electron signal as a base of an electron-beam image necessary for inspection. Inspection is carried out by using an electron beam with a current value not lower than 270 pA, preferably, not lower than 13 nA. This current value is achieved by setting the root of the number of irradiated electrons to be sufficiently larger than the SN ratio in the electron-beam image necessary for inspection. The second means is to converge the electron beam so that the diameter of the electron beam on the sample becomes sufficiently small at the time of irradiation of a large-current electron beam onto the sample to thereby secure the resolution necessary for the inspection of a micro circuit pattern. As described in the prior art, in the observation of, by means of an electron beam, a semiconductor, or the like, having an electrically insulating material, the energy of the electron beam irradiated onto the sample is preferably selected to be low-accelerated. In a large-current and low-accelerated electron beam, aberration caused by the space-charge effect occurs so that it becomes difficult to converge the electron beam on the sample. Therefore, this problem can be solved by using the same method as described above with respect to the means for controlling the energy of the electron beam irradiated onto the sample. That is, the space-charge effect can be suppressed by generating a high-accelerated electron beam from an electron source, and the diameter of the electron beam on the sample can be converged to secure required resolution by applying a negative potential to a sample or sample stage to retard the high-accelerated electron beam just before the sample and radiate an electron beam of substantially optimum low-accelerated energy onto the sample. The third means is to efficiently lead secondary electrons generated from a surface to a detector to thereby secure the SN ratio of the electron-beam image necessary for inspection. When an electron beam is irradiated onto a sample by the second means, secondary electrons generated from the sample are contrariwise accelerated by the electric field of a negative potential for decelerating the primary electron beam. The accelerated secondary electrons are deflected by the E×B deflector so as to be led to the detector. By deflecting the secondary electrons to radiate the secondary electrons onto a metal piece provided between the light path of the primary electron beam and the detector, and further leading the low-speed secondary electrons generated from the metal piece to the detector, the quantity of deflection can be reduced without any necessity of deflecting high-speed secondary electrons largely toward the detector. By this measure, the problem which occurs when high-speed secondary electrons are deflected largely, that is, the problem of the loss of secondary electrons caused by the collision of secondary electrons with the deflector, the lowering of resolution caused by the influence on the primary electron beam, and so on, can be solved. Furthermore, by using a material high in secondary electron generating efficiency as the metal piece, a larger number of secondary electrons than the number of electrons in the primary electron beam can be obtained and, consequently, the SN ratio in the image can be improved. The fourth means is to digitize an analog signal detected by a semiconductor detector which is used as a detector for forming an image with a high SN ratio at a high speed and to transmit the thus digitized signal. There is further provided means for converting the digitized signal into a light signal, transmitting the light signal by means of an optical fiber, or the like, and converting the transmitted signal into an electric signal again. The constituent elements from the semiconductor detector to the photo-conversion means are floated at a positive potential. Thus, the analog signal detected by the semiconductor detector is subjected to light transmission after it is digitized by an AD converter. By use of the semiconductor detector, the responsibility necessary for detecting secondary electrons at a high speed can be secured. By digitized signal light-transmission, noise can be suppressed because digital discrimination between 1 and 0 is never influenced by noise even in the case where more or less noise is generated in a light-emitting element or in a light-receiving element in the photoelectric conversion means. Further, by making the elements from the semiconductor detector to the photo-conversion means float at a positive potential, secondary electrons can be led into the semiconductor detector so that circuits after the photo-conversion means can be operated at the ground potential. Accordingly, secondary electrons generated from a sample by irradiation of an electron beam onto the sample can be detected at a high speed with little influence of noise.

By the aforementioned various means, a stable image can be obtained with respect to a circuit pattern having an electrically insulating material in a condition in which the fluctuation of image contrast caused by charge is suppressed, so that a high sensitivity, high speed and high SN ratio electron-beam image can be formed.

Of the two means, that is, a method which is effective for inspecting an aforementioned circuit pattern having an electrically insulating material and in which an electron beam is irradiated once or several times at a high speed so that an electron-beam image is obtained before occurrence of the change of a potential due to charge, and a method in which an electron beam or other charge particle beam is irradiated so that an electron-beam image is obtained after the state of charge is stabilized, the former has been described. Means for the latter inspection method will be described below.

To stabilize the state of charge before inspection in the latter method, there are two means. The first means is a method in which a second charge particle beam such as an electron beam, an ion beam, plasma, an electron shower, or the like, is irradiated in advance onto a substrate to be inspected, in a sub chamber, or the like, different from a chamber used for inspection so as to charge the substrate to a positive or negative potential before inspection. The second means is to radiate a second electron beam onto a substrate to be inspected, in a state in which the substrate is carried to a chamber for inspection and placed in a position for forming an inspection image. In order to radiate the second electron beam onto the region to be inspected before inspection without influence on inspection:

(1) the time of irradiation of the first electron beam for forming an inspection image and the time of irradiation of the second electron beam are shifted from each other; (2) the first electron beam for forming an inspection image is subject to raster-scanning on the substrate to be inspected whereas the second electron beam is irradiated in a period in which the first electron beam turns back in the scanning; (3) the first electron beam for forming an inspection image and the second electron beam are coaxially simultaneously irradiated onto a substrate to be inspected so that not only the diameter of the second electron beam is sufficiently larger than that of the first electron beam but also the maximum current density of the second electron beam is sufficiently smaller than the maximum current density of the first electron beam. As for the configuration thereof, one second electron beam source or a plurality of second electron beam sources may be disposed in the peripheral portion of an opening through which the first electron beam for forming an inspection image is irradiated so that not only the respective second electron beam sources operate independently but also each second electron beam is irradiated onto a region to be inspected in a substrate to be inspected before the first electron beam is irradiated.

As means for irradiating the second charge particle beam by a method other than the aforementioned methods, the charge particle beam may be an ion beam and an ion source is provided in the peripheral portion of the opening through which the first electron beam for forming an inspection image is irradiated so that the ion beam is irradiated onto the substrate to be inspected at the time of inspection of the subject to be inspected. As for the timing of irradiation, there is no problem when the time of irradiation of the first electron beam and the time of irradiation of the ion beam are staggered in the same manner as in the case where the second charge particle beam is an electron beam or when the ion beam is irradiated in a period in which the scanning of the first electron beam turns back.

By the aforementioned means, an electron-beam image for a circuit pattern having an electrically insulating material can be formed in an always stable state of charge by irradiating the first electron beam for forming an inspection image after irradiating the second charge particle beam onto a substrate to be inspected to make the state of charge in a surface of the substrate uniform. According to the electrically insulating material, the contrast between the electrically insulating material and the sub-layer may be increased when the substrate is charged. In this case, the method of irradiating the second charge particle beam according to the present invention becomes effective because sufficient contrast for comparison and inspection cannot be obtained though the fluctuation of the electron-beam image caused by charge can be suppressed when only the condition for irradiation of the first electron beam for forming an inspection image is controlled.

In the aforementioned means for forming an electron-beam image after stabilizing the state of charge in a surface of the substrate to be inspected by the second charge particle beam, the condition and means for irradiation of the first electron beam are the same as in the means for irradiating the first electron beam once or several times so that an image is formed before the change caused by charge occurs. Further, means for performing inspection at a high speed and means for making the image quality of the electron-beam image have a high SN ratio and a high resolution at the time of high-speed inspection are the same as in the aforementioned means. Further, in the means for forming an electron-beam image for inspection by the first electron beam after irradiating the second charge particle beam to stabilize charge, means for adjusting the state of charge can be used additionally by controlling the irradiation energy of the first electron beam and second charge particle beam irradiated onto the sample. In the case where a charge particle beam other than the electron beam for forming an image is irradiated simultaneously or nearly simultaneously with the irradiation of the electron beam, there is a possibility that a secondary electron signal unnecessary for forming the original image may be generated and detected. In this case, an aperture is placed on an image plane of the surface of the substrate on which forms an image of a circuit pattern of a substrate to be inspected by secondary electrons, so that only the secondary electrons generated from the region subjected to irradiation of the electron beam for forming an inspection image can be passed through the aperture and led to the secondary electron detector to thereby eliminate unnecessary secondary electrons.

Among the means for inspecting a substrate having a micro circuit pattern by an electron beam, various means for forming an electron-beam image have been described above. Means for detecting a defect generated on a circuit pattern on the basis of an electron-beam image will be described below. Secondary electrons generated from a surface of a sample by irradiating a first electron beam onto a first region of the sample is detected at a high speed and with high efficiency, so that an image signal of the electron beam from the first region of the substrate to be inspected is obtained and stored in a first storage portion. In this occasion, if necessary, a second charge particle beam is irradiated before the irradiation of the first electron beam. Similarly, an electron-beam image of a region which is a second region of the sample and which has the same circuit pattern as that of the first region is obtained. After detailed position adjustment with respect to images of the first and second regions is carried out in an image processing portion while the electron-beam image of the second region is stored in a second storage portion, a differential image is obtained by comparison between the images of the first and second regions. A pixel in which the absolute value of the brightness of the differential image is not smaller than a predetermined threshold is determined to be a candidate for a defect. In another means, an electron-beam image of a good-quality circuit pattern different from that of the substrate to be inspected is formed in a redetermined condition and stored in the first storage portion in advance. The first region of the substrate to be inspected is irradiated with a first electron beam and the secondary electrons generated from a surface of the sample is detected at a high speed and with high efficiency to thereby obtain an electron-beam image signal of the first region of the substrate to be inspected. The image is compared with the image of the good-quality circuit pattern stored in the first storage region, and a processing is performed such that the inspection image is determined as a defect when the absolute value of the brightness of the differential image is larger than a predetermined threshold. Also in this occasion, if necessary, a second charge particle beam is irradiated before the irradiation of the first electron beam. Further, because an image is formed by irradiating the first electron beam once or several times onto each of the first and second regions of the substrate to be inspected, as means for preventing the electron beam from being irradiated onto regions other than the image-forming region, a monitor for adjusting the focal position of the first electron beam is irradiated always with a beam such as white light other than the electron beam and reflected high is monitored. Alternatively, the region to be inspected in the substrate to be inspected can be prevented from being charged locally and the cause of false detection can be eliminated by means in which an electron-beam image is acquired in a region other than the region to be inspected and the region to be inspected is managed so that inspection is always carried out by the irradiation of the electron beam in the first cycle when the condition for sensitivity and the condition for irradiation of the electron beam are set in accordance with the substrate to be inspected before inspection.

By carrying out the aforementioned inspection method, it is possible to realize a method and apparatus for inspection, in which a circuit pattern on a substrate containing an electrically insulating material is inspected at a high speed with high sensitivity by an electron beam so that a defect generated on the circuit pattern can be detected automatically.

By inspecting a substrate having a circuit pattern, for example, such as a semiconductor device in a way of producing process by using this method and apparatus, a failure or defect which is generated in the shape of the pattern by a process and which could not be detected in a semiconductor device in every step by the conventional technique, can be detected in an early stage. As a result, problems which are latent in processes, production apparatus conditions, and so on, can be actualized. Accordingly, a countermeasure against the cause of failure in high-speed high-accurate processes of producing various kinds of substrates such as semiconductor devices compared with the conventional processes can be taken. Accordingly, not only a high yield, that is, a high efficiency percentage can be secured but also high accurate inspection can be made because error detection which occurs in inspection and becomes a problem is reduced.

BRIEF DESCRIPTION OF THE DRAWINGS

FIG. 8 is a view showing the configuration of a main part of the electronic optical system of a third embodiment;

DESCRIPTION OF THE PREFERRED EMBODIMENTS

Embodiments of the present invention as to an example of the inspection method and apparatus will be described below in detail with reference to the drawings.

Embodiment 1

Figure 1:
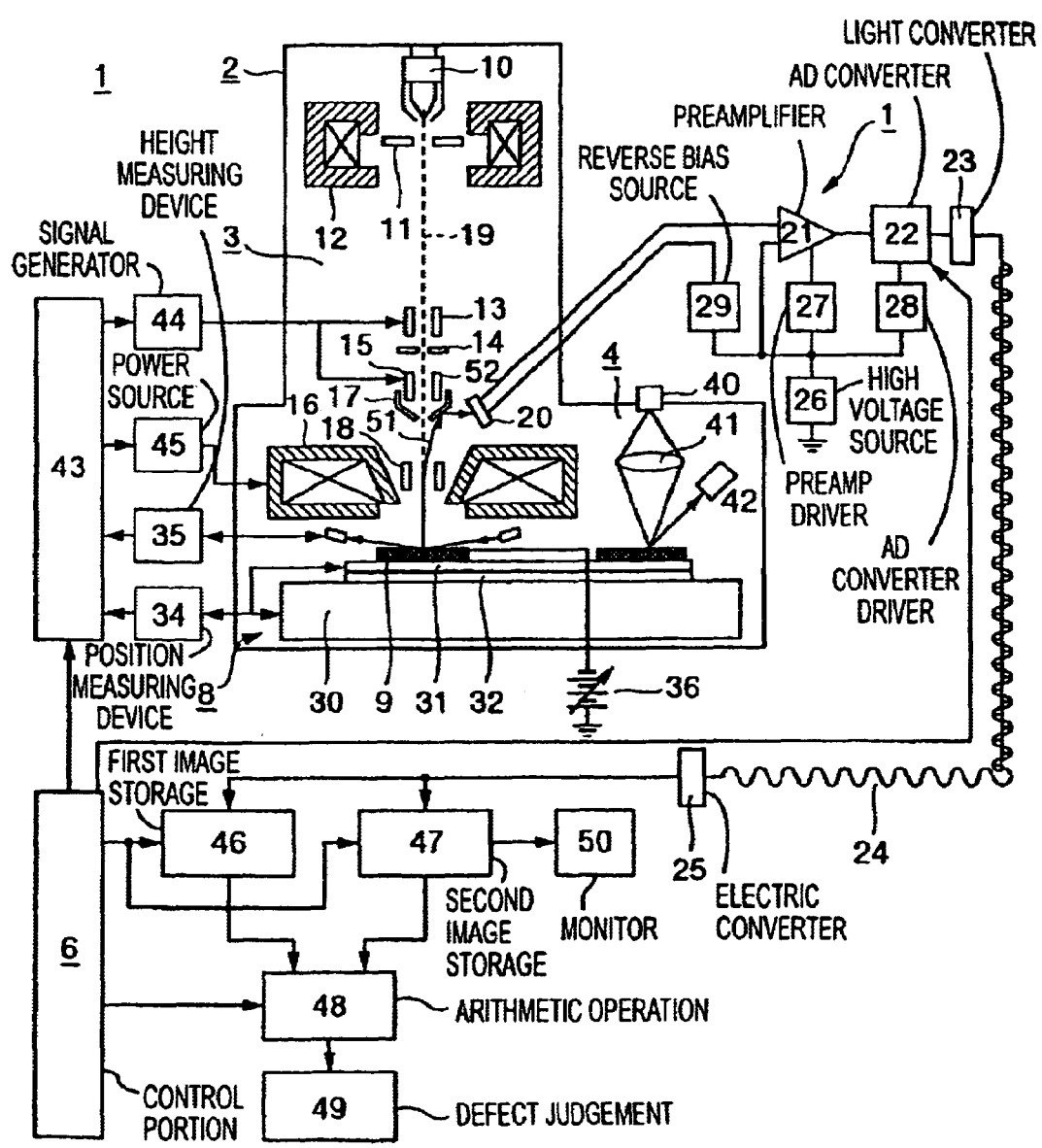
FIG. 1 is a view showing the configuration of a circuit pattern inspection apparatus.

FIG. 1 shows the configuration of a circuit pattern inspection apparatus 1 according to a first embodiment of the present invention. The circuit pattern inspection apparatus 1 has an inspection chamber 2 to be evacuated, and a sub chamber (not shown in this embodiment) for carrying a sample substrate 9 into the inspection chamber 2. The sub chamber is configured so as to be able to be evacuated independently of the inspection chamber 2. The circuit pattern inspection apparatus 1 is constituted by a control portion 6, an image processing portion 5 in addition to the inspection chamber 2 and the sub chamber. The inside of the inspection chamber 2 is roughly constituted by an electronic optical system 3, a secondary electron detection portion 7, a sample chamber 8, and an optical microscope portion 4. The electronic optical system 3 has an electron gun 10, an electron beam extracting electrode 11, a condenser lens 12, a blanking deflector 13, a scanning deflector 15, an aperture 14, an objective lens 16, a reflection plate 17, and an E×B deflector 18. The secondary electron detection portion 7 has a secondary electron detector 20 which is disposed above the objective lens 16 in the inspection chamber 2. The output signal of the secondary electron detector 20 is amplified by a preamplifier 21 disposed in the outside of the inspection chamber 2 and is converted into digital data by an AD converter 22. The sample chamber 8 is constituted by a sample stage 30, an X stage 31, a Y stage 32, a rotation stage 33, a position monitoring measuring device 34, and an inspection-subject substrate height measuring device 35. The optical microscope portion 4 is disposed near the electronic optical system 3 in the inspection chamber 2 but at a distance from the electronic optical system 3 so that the two have no influence on each other. The distance between the electronic optical system 3 and the optical microscope portion 4 is known. Further, the X stage 31 or Y stage 32 is designed so as to make a reciprocating motion at the known distance between the electronic optical system 3 and the optical microscope portion 4. The optical microscope portion 4 is constituted by a light source 40, an optical lens 41, and a CCD camera 42. The image processing portion 5 is constituted by a first image storage portion 46, a second image storage portion 47, an arithmetic operation portion 48, and a defect judgment portion 49. An electron-beam image or optical image taken in is displayed on a monitor 50. Instructions and conditions for operating respective portions of the apparatus are inputted/outputted through the control portion 6. Conditions such as the accelerated voltage at the time of generation of an electron beam, the electron-beam deflection width, the deflection speed, the signal fetch timing of the secondary electron detector, the moving speed of the sample stage, etc. are inputted into the control portion 6 in advance so as to be able to be set freely or selectively in accordance with the purpose. The control portion 6 uses a position correct control circuit 43 to monitor positional or height displacement from signals of the position monitoring measuring device 34 and the inspection-subject substrate height measuring device 35, generate correct signals from results thereof and feed the correct signals to the objective lens source 45 and the scanning deflector 44 so that the electron beam is irradiated onto an always correct position.

In order to acquire an image of the inspection-subject substrate 9, secondary electrons 51 generated by irradiating a converged electron beam 19 onto the inspection-subject substrate 9 are detected in synchronism with the scanning of the electron beam 19 and the movement of the stages 31 and 32 to thereby obtain an image of a surface of the inspection-subject substrate 9. As described above in the Summary of the Invention, a high inspection speed is essential to the automatic inspection in the present invention. Accordingly, low-speed scanning of an electron beam having an electron beam current of the order of pA as used in the general SEM or multiple repetition of scanning and superposition of respective images is not performed. Further, in order to suppress the charge of an electrically insulating material, it is necessary that electron-beam scanning is made at a high speed once or repeated several times. Therefore, this embodiment is configured so that an image is formed by only once scanning an electron beam with a large current, for example, of 100 nA which is not smaller than about 100 times as large as the current in the general SEM. The scanning width is selected to be 100 μm and one pixel is selected to be 0.1 μm" so that one scanning is performed in 1 μs.

A diffusion supply type thermal field emission electron source is used in the electron gun 10. An electron-beam image little in the change of brightness is obtained by using this electron gun 10 because a stable electron-beam current can be secured, for example, in comparison with a conventional tungsten (W) filament electron source or field-free emission type electron source. Further, high-speed inspection as will be described later can be realized because the electron-beam current can be selected to be large by this electron gun 10. An electron beam 19 is extracted from the electron gun 10 by applying a voltage between the electron gun 10 and the extraction electrode 11. Acceleration of the electron beam 19 is performed by applying a high-voltage negative potential to the electron gun 10. As a result, the electron beam 19 is irradiated toward the sample stage 30 by energy corresponding to the potential, converged by the condenser lens 12, and the objective lens 16 and then irradiated onto the inspection-subject substrate 9 (a micro circuit pattern-containing substrate such as a semiconductor wafer, a semiconductor chip, a liquid crystal, a mask, or the like) mounted on the X-Y stages 31 and 32 on the sample stage 30. Incidentally, a signal generator 44 for generating a scanning signal and a blanking signal is connected to the blanking deflector 13 and lens electric sources 45 are connected to the condenser lens 12 and the objective lens 16 respectively. It is designed so that a negative voltage can be applied to the inspection-subject substrate 9 by a high-voltage electric source 36. The primary electron beam is retarded by adjusting the voltage of this high-voltage electric source 36 so that the irradiation energy of the electron beam onto the inspection-subject substrate 9 can be adjusted to an optimum value without any change of the potential of the electron gun 10.

Secondary electrons 51 generated by irradiation of the electron beam 19 onto the inspection-subject substrate 9 are accelerated by a negative voltage applied to the substrate 9. The accelerated secondary electrons 51 are deflected to a predetermined direction by the E×B deflector 18 which is disposed above the inspection-subject substrate 9. The quantity of deflection can be adjusted in accordance with the voltage and the intensity of magnetic field applied to the E×B deflector 18. Further, this electro-magnetic field can be changed so as to be interlocked with the negative voltage applied to the sample. The secondary electrons 51 deflected by the E×B deflector 18 collide with the reflection plate 17 in a predetermined condition. This reflection plate 17 is united with a shield pipe of a deflector for an electron beam irradiated onto the sample (hereinafter referred to as primary electron beam) so as to be shaped like a cone. When the accelerated secondary electrons 51 collide with this reflection plate 17, second secondary electrons 52 having energy in a range of from several V to 50 eV are generated from the reflection plate 17.

The secondary electron detection portion 7 is constituted by: the secondary electron detector 20 disposed in the inside of the evacuated inspection chamber 2; and a preamplifier 21, an AD converter 22, a light converting means 23, a transmission means 24, an electric converting means 25, a high-voltage electric source 26, a preamplifier drive electric source 27, an AD converter drive electric source 28, and a reverse bias electric source 29 which are disposed in the outside of the inspection chamber 2. As described above, the secondary electron detector 20 in the secondary electron detection portion 7 is disposed above the objective lens 16 in the inspection chamber 2. The secondary electron detector 20, the preamplifier 21, the AD converter 22, the light converting means 23, the preamplifier drive electric source 27 and the AD converter drive electric source 28 are floated in a positive potential by the high-voltage electric source 26. The second secondary electrons 52 generated by collision with the reflection plate 17 are led to the detector 20 by this suction electric field. The secondary electron detector 20 is configured so that the second secondary electrons 52 generated when the secondary electrons 51 generated in a period of irradiation of the electron beam 19 onto the inspection-subject substrate 9 and then accelerated collide with the reflection plate 17 are detected in synchronism with the scanning timing of the electron beam 19. The output signal of the secondary electron detector 20 is amplified by the preamplifier 21 disposed in the outside of the inspection chamber 2 and is converted into digital data by the AD converter 22. The AD converter 22 is configured so that the analog signal detected by the semiconductor detector 20 is converted into a digital signal so as to be transmitted to the image processing portion 5 immediately after the analog signal is amplified by the preamplifier 21. Because the detected analog signal is transmitted after digitized immediately after the detection thereof, a high-speed and high-SN-ratio signal can be obtained in comparison with the conventional signal.

The inspection-subject substrate 9 is mounted on the X-Y stages 31 and 32, so that there can be selected a method of two-dimensionally scanning the electron beam 19 while keeping the X-Y stages 31 and 32 stationary at the time of execution of inspection or a method of linearly scanning the electron beam 19 in the X direction while continuously moving the X-Y stages 31 and 32 at a constant speed in the Y direction at the time of execution of inspection. The former method in which inspection is performed while the stages are kept stationary is effective for inspection of a specific, relatively narrow region. The latter method in which inspection is performed while the stages are continuously moved at a constant speed is effective for inspection of a relatively wide region. Incidentally, when the electron beam 19 is required to be blanked, the electron beam 19 can be controlled to be deflected by the blanking deflector 13 so that the electron beam does not pass through the aperture 14.

In this embodiment, a measuring device using laser interference was used as the position monitoring measuring device 34. Configuration is made so that the position of the X stage 31 and the position of the Y stage 32 can be real-time monitored and transferred to the control portion 6. Configuration is made so that also data such as rotational speeds of motors for the X stage 31, Y stage 32 and rotation stage 33, and so on, are transferred from respective drivers to the control portion 6. Accordingly, the control portion 6 can accurately grasp the region and position of irradiation of the electron beam 19 on the basis of these data and, if necessary, the positional displacement in the position of irradiation of the electron beam 19 can be corrected in real-time by the position correct control circuit 43. Further, the region subjected to electron beam irradiation can be stored for every inspection-subject substrate.

An optical measuring device using a measuring method other than the electron beam method, for example, a laser interference measuring device or a reflected light type measuring device for measuring a change in accordance with the position of reflected light is configured to be used as the optical height measuring device 35 so that the height of the inspection-subject substrate 9 mounted on the X-Y stages 31 and 32 is real-time measured. In this embodiment, there is used a method in which long and narrow white luminescence which has passed through a slit is irradiated onto the inspection-subject substrate 9 through a transparent window so that the position of reflected light is detected by the position detection sensor and, accordingly, the quantity of change of the height is calculated in accordance with the change of the position. The focal length of the objective lens 16 for converging the electron beam 19 is configured to be dynamically corrected on the basis of the data measured by this optical height measuring device 35 so that the electron beam 19 always focused on an inhibit area can be irradiated. Further, the warp or height distortion of the inspection-subject substrate 9 can be also configured to be measured before electronic beam irradiation, so that a condition for correcting the objective lens 16 is set for every detection region in accordance with the data.

The image processing portion 5 is constituted by a first image storage portion 46, a second image storage portion 47, an arithmetic operation portion 48, a defect judgment portion 49 and a monitor 50. After a signal of an image of the inspection-subject substrate 9 detected by the secondary electron detector 20 is amplified by the preamplifier 21 and digitized by the AD converter 22, the signal is converted into a light signal by the light converter 23. After the light signal is transmitted through an optical fiber 24 and converted into an electric signal again by the electric converter 25, the electric signal is stored in the first image storage portion 46 or the second storage portion 47. The arithmetic operation portion 48 carries out various kinds of image processing for position alignment of the image signal in one storage portion with an image signal stored in the other storage portion, standardization of the signal level and removal of a noise signal to thereby perform an arithmetic operation for comparing the two image signals. The defect judgment portion 49 compares the absolute value of the differential image signal obtained by the comparison arithmetic operation in the arithmetic operation portion 48 with a predetermined threshold so that, when the level of the differential image signal is larger than the predetermined threshold, the defect judgment portion 49 judges the pixel as a candidate for a defect and displays the position of the pixel and the number of defects on the monitor 50, etc.

Although the overall configuration of the circuit pattern inspection apparatus 1 has been described above, the configuration and operation of the means for detecting the secondary electrons 51 will be described below more in detail. When the primary electron beam 19 is incident to a solid body, energy is lost as electrons in the shell are excited at each depth while the primary electron beam 19 enters into the inside of the solid body. Further, at the same time, there arises a phenomenon, as being expected, in which reflected electrons of the primary electron beam scattered backward also go toward a surface of the solid body while electrons in the solid body are excited. After these plurality of processes, electrons in the shell cross a surface barrier out of the surface of the sold body and go into a vacuum in the form of secondary electrons with energy in a range of from several V to 50 eV. The smaller the angle between the primary electron beam and the surface of the solid body, the smaller the ratio of the penetration distance of the primary electron beam to the distance from the position to the surface of the solid body, so that secondary electrons are apt to be emitted from the surface. Accordingly, the generation of secondary electrons depends on the angle between the primary electron beam and the surface of the solid body, so that the quantity of generated secondary electrons becomes information expressing the surface roughness and material of the sample.

Figure 2:
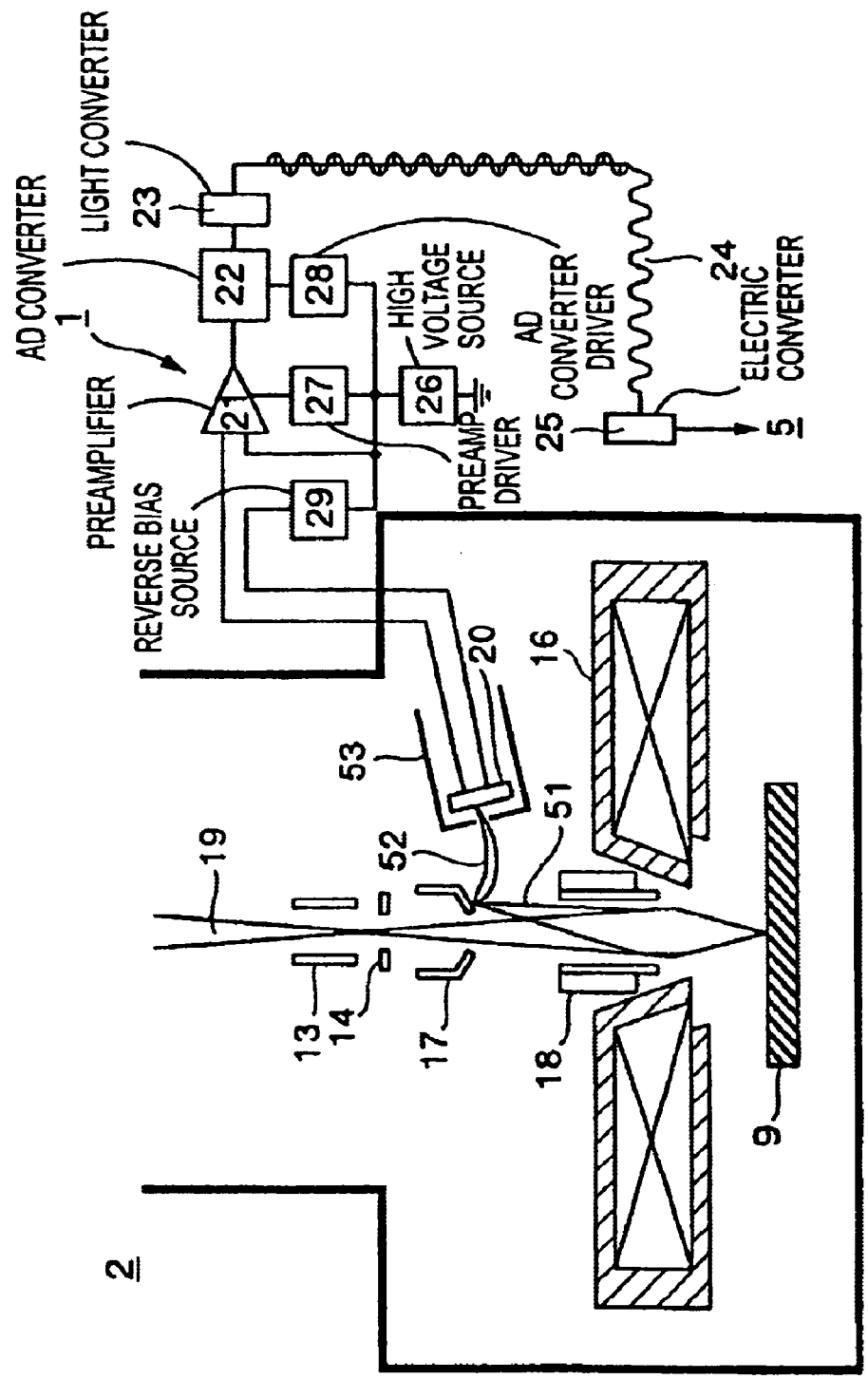
FIG. 2 is a view showing the configuration of a main part of a electronic optical system and a secondary electron detection portion.

FIG. 2 shows a main configuration view of the electronic optical system 3 and secondary electron detection portion 7 for detecting secondary electrons 51. When a primary electron beam 19 is irradiated onto a sample substrate 9, secondary electrons 51 are generated in a surface of the sample substrate 9. The secondary electrons 51 are accelerated by a negative high voltage applied to the sample substrate 9. In this embodiment, the negative voltage applied to the sample substrate 9 was set to 3.5 keV. While accelerated, the secondary electrons 51 are converged by the objective lens 16 and deflected by the E×B deflector 18 to collide with the reflection plate 17. The reflection plate 17 is united with a shield pipe for preventing the influence of the voltage applied to the detector, or the like, on the primary electron beam so that the reflection plate 17 is shaped like a cone tapered at 30 degrees. The material therefor was CuBeO so that a secondary electron multiplying effect was given as a configuration for emitting secondary electrons about five times as large as the number of irradiated electrons on average. By the collision of the accelerated secondary electrons 51, second secondary electrons 52 having energy in a range of from several V to 50 eV are generated from the reflection plate 17. The second secondary electrons 52 are sucked to the front surface of the secondary electron detector 20 by the suction electric field generated by the secondary electron detector 20 and a suction electrode 53 attached to the secondary electron detector 20. In this embodiment, a condition in which the voltage and magnetic field applied to the E×B deflector 18 and the distance between electrodes were 35 V, 1.0–10-6 T (Tesla) and 10 mm respectively was set in the case where the negative high voltage applied to the sample substrate 9 was 3.5 keV because secondary electrons 51 generated from the surface of the sample substrate 9 were designed so as to be deflected by about 5 degrees toward the secondary electron detector 20 by the E×B deflector 18. The electro-magnetic field can be set so as to be changeable correspondingly to the negative high voltage applied to the sample substrate 9. According to the aforementioned configuration and condition, 95% or more of secondary electrons 51 generated from the surface of the sample substrate 9 could be made to pass through the E×B deflector 18 by the deflection at a small angle up to about 5 degrees, the acceleration by the −3.5 keV voltage applied to the sample substrate 9 and the convergence based on the objective lens, so that 95% of the secondary electrons 51 were multiplied to a quantity of about 5-fold by the reflection plate 17 to thereby make second secondary electrons 52 generated.

In this embodiment, a PIN type semiconductor detector was used as the secondary electron detector 20. Because the PIN type semiconductor detector had higher responsibility than that of a general PN type semiconductor detector, a high-frequency secondary electron signal with a sampling frequency not larger than 100 MHz could be detected when a reverse bias voltage was applied by a reverse bias voltage electric source. The PIN type semiconductor detector 20 and the preamplifier 21, AD converter 22 and light converting means 23 which form a detection circuit were floated at 6 keV and the suction electrode 53 was set to be 0 V. Incidentally, the effective size of the PIN type semiconductor detector 20 is 4 mm". The second secondary electrons 52 generated from the reflection plate 17 are sucked by the PIN type semiconductor detector 20 on the basis of the suction electric field so that the second secondary electrons 52 in a high energy state enter into the PIN type semiconductor detector 20. After a predetermined amount of energy is lost by a surface layer, electron-hole pairs are generated to form an electric current to thereby convert the electrons 52 into an electric signal. Because the signal detection sensitivity of the PIN type semiconductor detector 20 used in this embodiment is very high, the incident second secondary electrons 52 accelerated to 6 keV by the suction electric field form an electric signal amplified to about 1000 times, if the energy loss in the surface layer is taken into consideration. This electric signal is further amplified by the preamplifier 21 and the amplified signal (analog signal) is converted into a digital signal by the AD converter 22. In this embodiment, a 12-bit converter with a clock frequency of 100 MHz was used as the AD converter 22. Further, a light converting means 23, a transmission means 24 and an electric converting means 25 were provided for every bit so that the output of the AD converter 22 was parallelly transmitted. According to this configuration, the transmission means may be achieved if the transmission rate in each of the transmission means is equal to the clock frequency of the AD converter 22. Incidentally, the signal converted into the optical digital signal by the light converting means 23 is transmitted to the electric converting means 25 by the light transmission means 24, in which the optical digital signal is converted into an electric signal again so that the electric signal is fed to the image processing portion 5. The reason why the signal is transmitted after converted into a light signal is that the constituent elements of from the PIN type semiconductor detector 20 to the light converting means 23 are floated at a positive high potential by the high-voltage electric source 26. According to the configuration of this embodiment, a high potential level signal can be converted into an earth level signal. Further, in this embodiment, a light-emitting element for converting an electric signal into a light signal is used as the light converting means 23, an optical fiber cable for transmitting the light signal is used as the transmission means 24 and a light-receiving element for converting a light signal into an electric signal is used as the electric converting means 25. Because the optical fiber cable is formed from a highly electrically insulating material, a high potential level signal can be easily converted into an earth potential level signal. Further, because the digital signal is optically transmitted, there is no deterioration of the signal at the time of light transmission. As a result, an image little influenced by noise can be obtained in comparison with the prior art configuration in which the analog signal is optically transmitted. By these configurations, a high-frequency secondary electron signal having a sampling frequency of 100 MHz can be detected with signal SN ratio not lower than 50 in the case where the current of the second secondary electrons 52 incident to the PIN type semiconductor detector 20 is 100 nA.

Further, in the above embodiment, although a reverse bias voltage is applied to the semiconductor detector 20 from the reverse bias voltage source 29, another structure in which such a reverse bias voltage is not applied may be used. Although the aforementioned embodiment has shown the case where a PIN type semiconductor detector is used as the semiconductor detector 20, a semiconductor detector of any other type, for example, a Schottky type semiconductor detector, an avalanche type semiconductor detector, or the like, may be used. Further, an MCP (micro channel plate) may be also used as the detector if conditions for responsibility, sensitivity, etc. are satisfied.

The operation in the case where a semiconductor wafer having a pattern processed in a production process is inspected as the inspection-subject substrate 9 by the aforementioned circuit pattern inspection apparatus 1 will be described below. Though not shown in FIG. 1, first, the semiconductor wafer is loaded into a sample exchange chamber by means of carrying the semiconductor wafer 9. In the sample exchange chamber, the semiconductor wafer 9 is mounted on a sample holder. After the semiconductor wafer 9 is held and fixed by the sample holder, the sample exchange chamber is evacuated. When the degree of vacuum in the sample exchange chamber reaches a certain value, the semiconductor wafer 9 is carried to the inspection chamber 2 for inspection. In the inspection chamber 2, the semiconductor wafer 9 is mounted together with the sample holder on the sample stage 30, X-Y stages 31 and 32 and rotation stage 33 and supported and fixed. The set semiconductor wafer 9 is disposed in predetermined first coordinates under the optical microscope portion 4 by the X- and Y-direction movement of the X-Y stages 31 and 32 on the basis of predetermined inspection conditions registered in advance, so that an optical microscopic image of the circuit pattern formed on the semiconductor wafer 9 is observed by the monitor 50 and compared with an equivalent circuit pattern image stored in advance in the same position for the purpose of position rotating correction to thereby calculate a position correction value for the first coordinates. Then, the first coordinates are shifted to second coordinates which are separated at a predetermined distance from the first coordinates and in which a circuit pattern equivalent to that in the first coordinates is present, so that an optical microscopic image is observed and compared with a circuit pattern image stored for the purpose of position rotating correction in the same manner as described above to thereby calculate a position correction value for the second coordinates and the quantity of rotational displacement from the first coordinates. The rotation stage 33 is rotated by the calculated quantity of rotational displacement to thereby correct the quantity of rotation. Although this embodiment has shown the case where the quantity of rotational displacement is corrected by rotating the rotation stage 33, the quantity of rotational displacement can be corrected also by a method of correcting the scanning deflection position of the electron beam on the basis of the calculated quantity of rotational displacement without any rotation stage 33. In this observation of the optical microscopic image, a circuit pattern is selected so as to be able to be observed not only as an optical microscopic image but also as an electron-beam image. Further, for position correction in the future, the first coordinates, the quantity of positional displacement in the first circuit pattern on the basis of the observation of the optical microscopic image, the second coordinates and the quantity of positional displacement in the second circuit pattern on the basis of the observation of the optical microscopic image are stored and transferred to the control portion 6.

Further, the circuit pattern formed on the inspection-subject semiconductor wafer 9 is observed by using an optical microscopic image, so that the positions of chips in the circuit pattern on the semiconductor wafer 9 and the distances between chips or a repetitive pitch in a repetitive pattern such as in memory cells, or the like, are measured in advance and the measured values are inputted into the control portion 6. Further, the inspection-subject chip on the inspection-subject semiconductor wafer 9 and the inspection-subject region in the chip are set on the basis of the optical microscopic image and inputted into the control portion 6 in the same manner as described above. Because the optical microscopic image can be observed in relatively low magnifying power and because the subbing layer can be observed transparently in the case where the surface of the inspection-subject semiconductor wafer 9 is coated, for example, with a silicon oxide film, or the like, the arrangement of chips and the layout of the circuit pattern in each chip can be observed simply so that the region to be inspected can be set easily.

When the predetermined correction work using the optical microscope portion 4 and the preparation work for setting the region to be inspected, or the like, are completed in such a manner, the semiconductor wafer 9 is moved under the electronic optical system 3 by the movement of the X stage 31 and Y stage 32. When the semiconductor wafer 9 is disposed under the electronic optical system 3, the same work as the correction work carried out by the optical microscope portion 4 and the same work as the work for setting the region to be inspected are carried out by using an electron-beam image. In this occasion, the electron-beam image is acquired by the following method. The electron beam 19 is irradiated onto the same circuit pattern as that observed by the optical microscope portion 4 while being two-dimensionally scanned in the X and Y directions by the scanning deflector 44 on the basis of the corrected coordinates stored in position alignment by using the optical microscopic image. On the basis of the two-dimensional scanning of the electron beam, secondary electrons 51 generated from the observation-subject region are detected by the configuration and operation of the respective portions for detecting the secondary electrons to thereby acquire an electron-beam image. Because easy confirmation of the inspection position, position alignment and position matching are carried out in advance by using an optical microscopic image and because rotational correction is carried out in advance, the resolution is high in comparison with that of the optical image so that position alignment, position correction and rotational correction can be performed with high magnifying power and with high accuracy. Incidentally, when the electron beam 19 is irradiated onto the sample 9, the region subjected to irradiation is electrically charged. In order to avoid the influence of the electrical charge at the time of inspection, a circuit pattern existing in the outside of the inspection region is selected in advance as the circuit pattern to be subjected to the irradiation of the electron beam 19 in the inspection preparatory work for position/rotation correction, inspection region setting, etc. or it is designed that an equivalent circuit pattern in a chip other than the chip to be inspected can be selected automatically from the control portion 6. By this measure, the inspection image is never influenced by the irradiation of the electron beam 19 in the inspection preparatory work at the time of inspection.

Then, inspection is carried out. The condition for the electron beam 19 to be irradiated onto the inspection-subject semiconductor wafer 9 at the time of inspection is obtained by the following method. First, generally, the SN ratio in an electron-beam image has correlation with the root of the number S of irradiation electrons per unit pixel in the electron beam irradiated onto the sample. In the case where images are compared and inspected, the SN ratio needs be at least 10, preferably not lower than 50 because the SN ratio in the electron-beam image needs be a value by which the signal quantity in a normal portion and the signal quantity in a defect portion can be detected. Because the SN ratio in the electron-beam image has correlation with the root of the number S of irradiation electrons per unit pixel in the electron beam irradiated onto the sample as described above, at least 100 electrons per unit pixel are required for obtaining an SN ratio 10 and at least 2500 electrons must be irradiated for obtaining an SN ratio 50.

Further, the main object of application of the circuit pattern inspection method according to the present invention is to detect a micro defect which cannot be detected by an optical pattern inspection method as described above, that is, it was necessary to recognize the difference between images in micro pixels. In order to achieve this object, the pixel size in this embodiment is selected to be 0.1 μm. Accordingly, from the minimally required number of electrons per single pixel and the aforementioned pixel size, the required quantity of electron beam irradiation per unit area is 0.16 μC/cm2, preferably 4 μC/cm2. When this quantity of electron irradiation is to be obtained from the electron-beam current (about from the order of pA to the order of hundreds of pA) in the general SEM, 8000 seconds are required for irradiating 0.16 μC/cm2 electrons onto a region of 1 cm2, for example, at a 20 pA electron-beam current and 200000 seconds are further required for irradiating 4 μC/cm2 electrons. The inspection rate required for inspection of the circuit pattern, for example, for inspection of the semiconductor wafer is, however, not larger than 600 s/cm2, preferably not larger than 300 s/cm2. If the inspection time is longer than this value, inspection in the production of a semiconductor is of very low practical use. Accordingly, in order to satisfy these conditions and radiate a necessary electron beam onto the sample in a practical inspection time, the electron-beam current need be set to be at least 270 pA (1.6 μC/cm2, 600 s/cm2), preferably not smaller than 13 nA (4 μC/cm2, 300 s/cm2). Therefore, the circuit pattern inspection method in this embodiment was designed so that an electron-beam image was formed by scanning by once with a large-current electron beam not smaller than 13 nA.

Further, it was cleared up from the present invention that the formation of an electron-beam image by scanning by only once with an electron beam at a large-current (not smaller than 270 nA, preferably not smaller than 13 nA) not smaller than about 100 times as large as that in the general SEM was not only necessary in terms of inspection rate but also necessary particularly for inspection of a circuit pattern including a subbing film or a surface pattern formed from an electrically insulating material for the following reason.

When an electron-beam image of a circuit pattern having an electrically insulating material is acquired by the general SEM, an electron-beam image having a shape different from the actual shape is often obtained due to the influence of electric charge or the contrast is often quite different in accordance with the visual field magnification. This is because the quantity of electron beam irradiation is concentrated into a certain place to make the electric charge of this place uneven by locally repetitively scanning a weak electric-beam current (from the order of pA to the order of hundreds of pA) or by locally scanning an electric beam over the electron beam quantity required for forming an image due to the focal point or astigmatic correction at the time of the changing of visual field magnification. As a result, the quality of an electric-beam image of a pattern formed from an electrically insulating material becomes quietly different in accordance with the visual field, so that such an image cannot be adapted for inspection based on comparison of electron-beam images. Accordingly, in order to make it possible to inspect a circuit pattern having an electrically insulating material in the same manner as a circuit pattern formed from an electrically conductive material, an electron-beam image was designed to be formed by scanning by once with an electric beam with a large current not smaller than about 100 times as large as that of the general SEM. That is, in this embodiment, the quantity of electron beam irradiation onto the sample per unit area and per unit time was designed to be constant so that an electron-beam image was acquired by scanning by once with an electric beam with the electron beam quantity necessary for forming sufficient image quality for comparison/inspection and with the scanning speed adapted for the practical use of the method for inspecting a semiconductor wafer, or the like. Further, it was confirmed that the quantity of electric charge and the contrast of the image vary depending on the constituent materials and structures of various circuit patterns constituting an electron-beam image in one visual field that the same image contrast was obtained in the case of the same pattern formed from the same kind of material, and when an electron-beam image of a circuit pattern having an electrically insulating material was acquired by scanning by once with an electron beam with a large-current not smaller than about 100 times as large as that of the general SEM as described above. Although this embodiment has shown the case where scanning of a large-current electron beam is carried out only once, scanning may be carried out several times in a range where the aforementioned operation can be realized substantially.

Figure 3A:
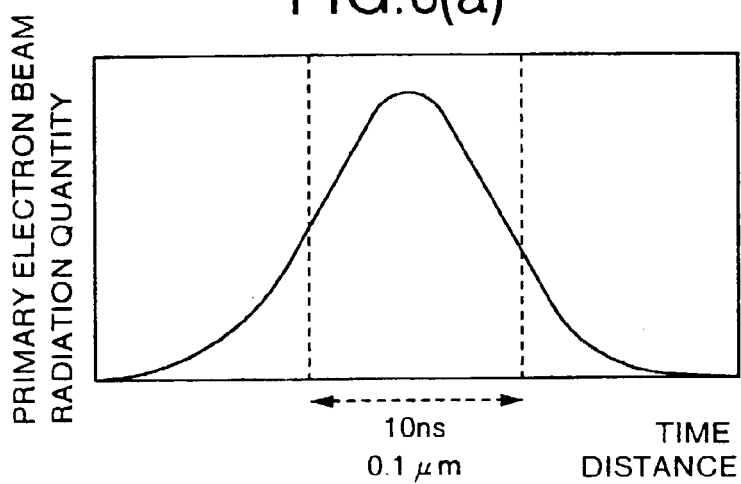
FIGS. 3(a), 3(b) and 3(c) are views showing correlation between electron beam irradiation, sample charge and secondary electron generation.
Figure 3B:
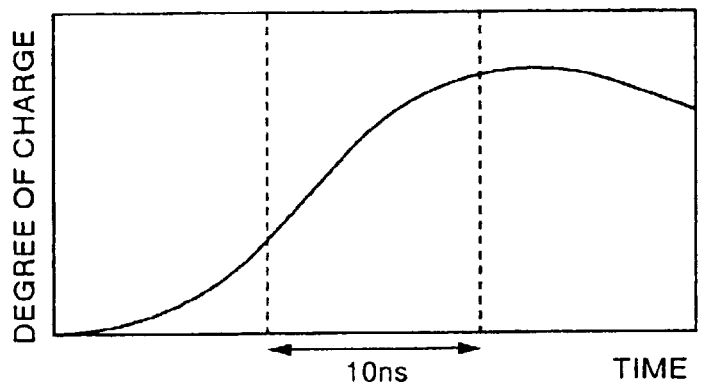
Figure 3C:
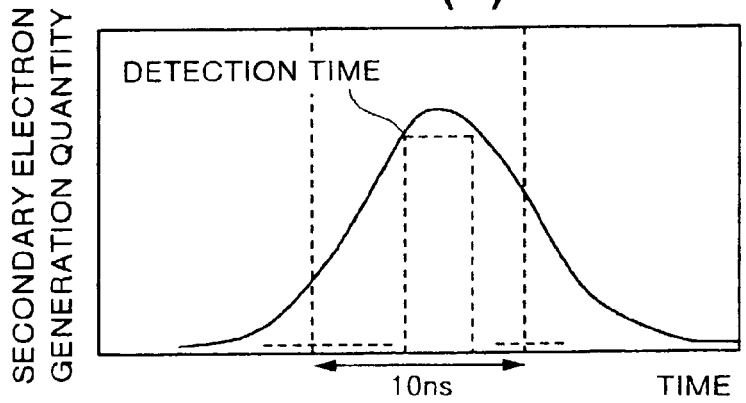

FIGS. 3(a), 3(b) and 3(c) typically show secondary electron generation efficiency and the degree of electric charge in the case where an electron beam is irradiated onto a point P of a sample. In FIG. 3(a), the vertical axis expresses the relative intensity of a primary electron beam irradiated onto the sample and the horizontal axis expresses time and distance. In FIG. 3(b), the vertical axis expresses the relative degree of electric charge of the sample and the horizontal axis expresses time. In FIG. 3(c), the vertical axis expresses the relative quantity of generated secondary electrons and the horizontal axis expresses time. When an electron beam is irradiated onto a sample by the aforementioned inspection method according to the present invention, the electron beam passes through the point P while scanning the point P at a high speed. In the time of 10 ns, a relatively intensive portion of the electron beam passes through the point P. In this embodiment, the time of 10 ns is equivalent to one pixel because the scanning speed of the electron beam is set to 100 MHz per pixel. Further, in this embodiment, the time of 10 ns is equivalent to 0.1 μm because one pixel is selected to be 0.1 μm". When the electron beam is irradiated onto the sample at the point P in the timing of FIG. 3(a), the sample is electrically charged as shown in FIG. 3(b). The degree of electric charge and the degree of electric discharge with the passage of time vary in accordance with the material for the sample. When the sample is an electrically insulating material, electric charge may remain after the passage of the electron beam so that electric discharge is not carried out unless a long time is passed. As shown in FIG. 3(c), secondary electrons are generated after an instance when the primary electron beam is irradiated onto the sample. The quantity of the generated secondary electrons depends on the secondary electron generation efficiency determined by material and the degree of electric charge shown in FIG. 3(b). Accordingly, for example, in the first scanning, the quantity of the secondary electrons shown in FIG. 3(c) are generated and, in the second scanning, the quantity of generated secondary electrons varies in the case where the degree of electric charge in the second scanning is different from the degree of electric charge in the first scanning.

Figure 4A:
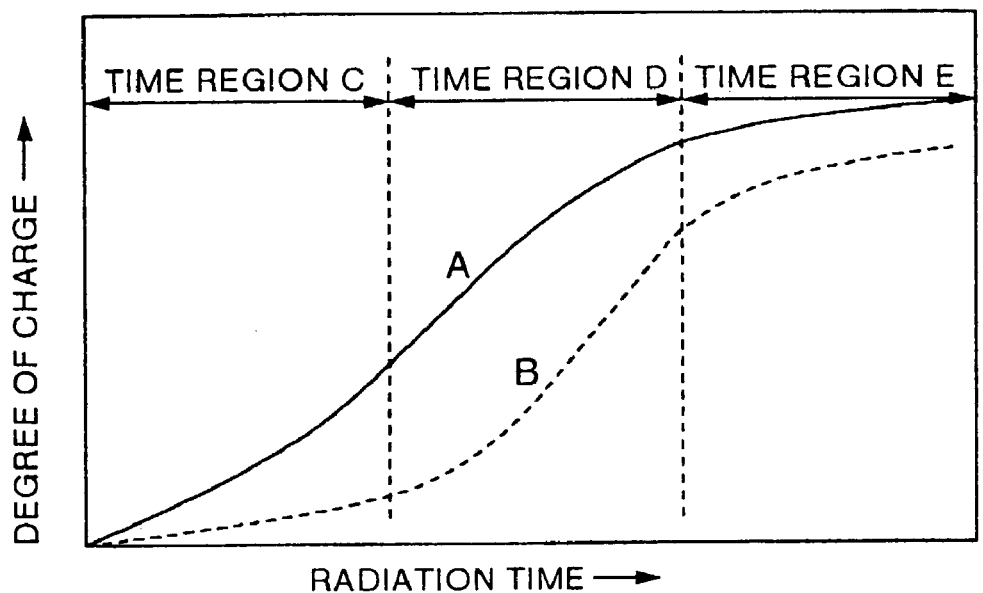
FIGS. 4(a) and 4(b) are views for explaining the influence of the condition of electron beam irradiation on the contrast.
Figure 4B:
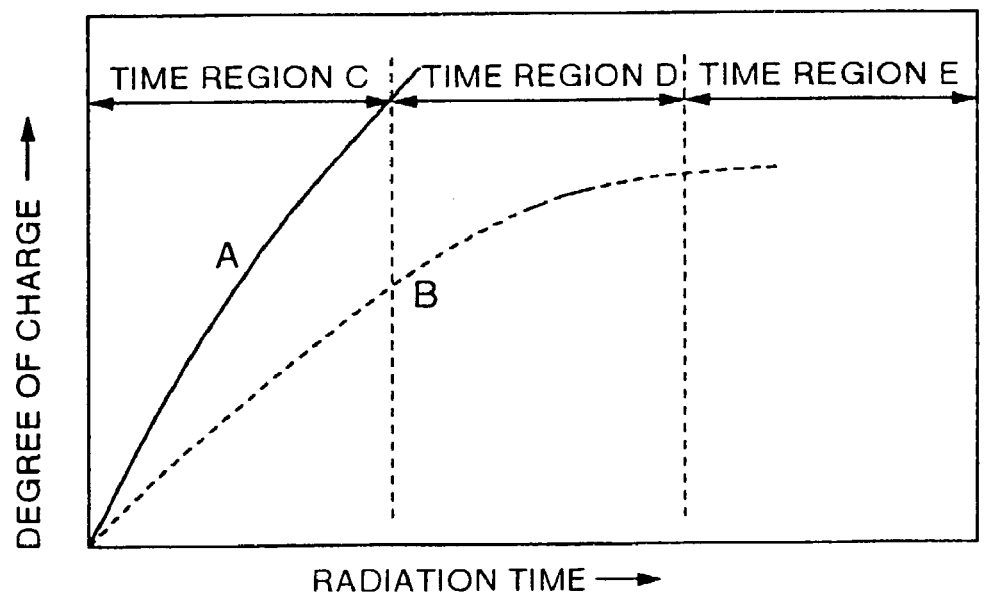

Irradiation conditions having influence on the contrast of the electron-beam image will be described below. The contrast of the electron-beam image is formed in accordance with the quantity of secondary electrons generated by the electron beam irradiated onto the sample and detected. For example, the difference in the quantity of generated secondary electrons caused by the difference in material forms the difference in brightness. FIGS. 4(a) and 4(b) are graphs showing the influence of the electron beam irradiation condition on the contrast. FIG. 4(a) shows the case where the irradiation condition is suitable, and FIG. 4(b) shows the case where the irradiation condition is unsuitable. Further, the vertical axis expresses the degree of electric charge which has a large correlation with the brightness of the image and the horizontal axis expresses the time of electron beam irradiation. The solid line A shows the case where a photo resist is used as the sample and the broken line B shows the case where a wiring material is used as the sample.

From FIG. 4(a), the fluctuation of the brightness of each material is small in the time region C in which the irradiation time is short, the change of the brightness by the irradiation time becomes large in the time region D in which the irradiation time becomes relatively long, and finally, the fluctuation of brightness by the irradiation time becomes small again in the time region E in which the irradiation time is long. Further, from FIG. 4(b), when the irradiation condition is unsuitable, the fluctuation of brightness with respect to the irradiation time is large even in the time region C in which the irradiation time is short, so that it is difficult to obtain a stable image. Accordingly, in order to acquire a high-speed and stable electron-beam image, it is important to acquire the image in the irradiation condition of FIG. 4(a).

Examples of the condition for irradiation of the electron beam onto the sample include the irradiation quantity of the electron beam per unit area, the current value of the electron beam, the scanning speed of the electron beam, and the irradiation energy of the electron beam irradiated onto the sample. Therefore, it is necessary to obtain optimum values of these parameters correspondingly to the shape and material of the circuit pattern. Therefore, it is necessary to freely adjust and control the irradiation energy of the electron beam irradiated onto the sample. Therefore, as described above, this embodiment is configured so that the high-voltage electric source 36 applies a negative voltage for retarding the primary electrons to the semiconductor wafer 9 which is the sample and so that the irradiation energy of the electron beam 19 can be suitably controlled by controlling this voltage. Although the axial change of the electron beam 19 occurs and various adjustments are required when the acceleration voltage applied to the electron gun 10 is changed, the same effect can be obtained in this embodiment by this measure without such adjustments.

The method of scanning the electron beam 19 for forming an electron-beam image to perform inspection according to the present invention will be described below. In the general SEM, an image of a certain region is formed by two-dimensionally scanning an electron beam in a state in which the stages are made stationary. According to this method, when a wide region is to be inspected thoroughly, there are required not only the time for making the stages stationary and scanning the electron beam by region for acquiring an image but also the time obtained by adding the acceleration, deceleration and position control of the stages as the moving time. Accordingly, a long time is required as the whole of the inspection time. Accordingly, in the present invention, there is used an inspection method in which an image of an inspection-subject region is acquired by scanning an electron beam at a high speed in one direction perpendicular to or crossing the direction of the movement of the stages while continuously moving the stages in one direction at a constant speed. By this method, the time for acquiring one-scanning-width's electric beam at a predetermined distance is made equal to only the time for moving the stages by the predetermined distance.

Figure 5A:
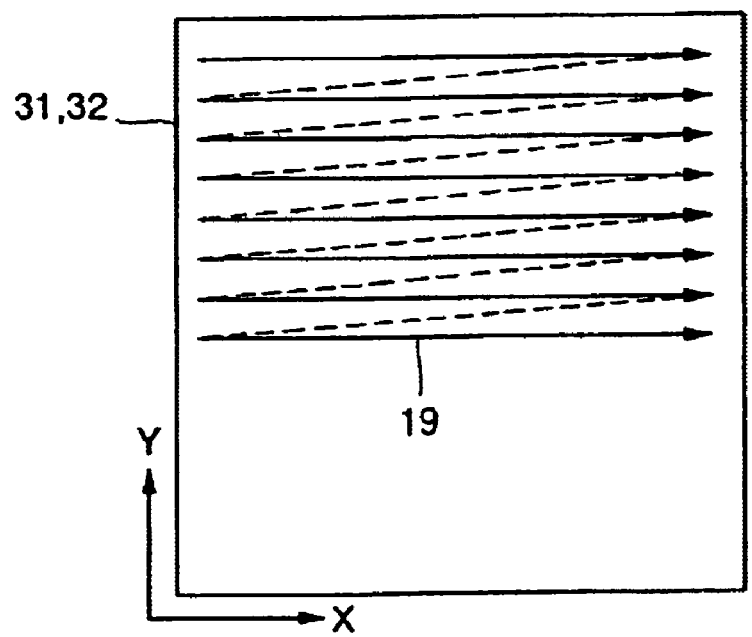
FIGS. 5(a) and 5(b) are views for explaining a electron scanning method.

FIG. 5(a) shows an example of the method of scanning the electron beam 19 when the Y stage 32 is continuously moved in Y direction at a constant speed by the aforementioned method. When the electron beam 19 is to be scanned by the scanning deflector 44, by irradiating the electron beam onto the semiconductor wafer 9 which is the sample, only in one direction expressed by the solid line and performing blanking so that the electron beam 19 is not irradiated onto the semiconductor wafer 9 in the electron beam return period expressed by the broken line, the electron beam can be irradiated onto the semiconductor wafer 9 evenly in terms of space and time. The electron beam 19 is deflected by the blanking deflector 13 so as not to pass through the aperture 14 to thereby perform blanking.

Figure 5B:
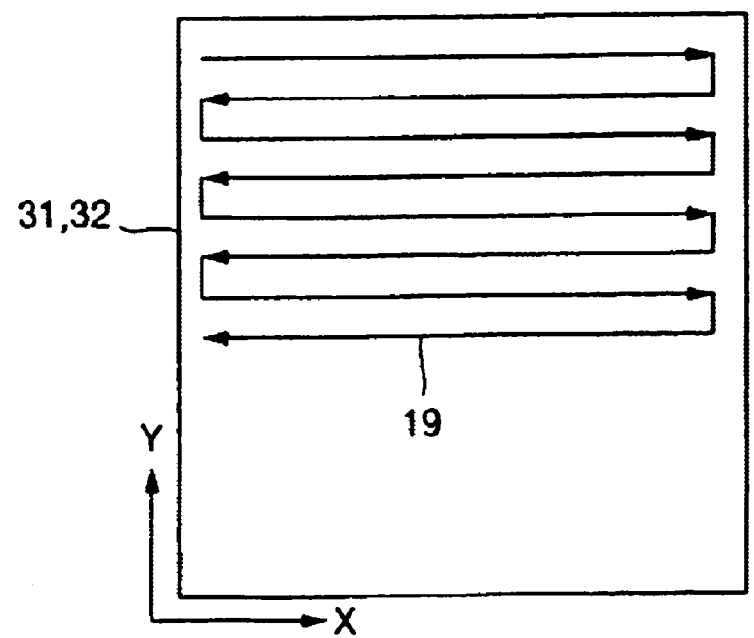

FIG. 5(b) shows, as another example of the scanning method, a method in which the electron beam 19 makes a reciprocating motion at a constant speed for scanning. When the electron beam 19 is scanned from one end to the opposite end at a constant speed, the X-Y stages 31 and 32 are fed by one pitch so that the electron beam is scanned toward the original end in a reverse direction at a constant speed. In the case of this method, the return time of the electron beam can be omitted.

Incidentally, the region or position on which the electron beam is irradiated is grasped in detail by real-time transferring the measurement data of the position monitoring measuring device 34 disposed in the X-Y stages 31 and 32, to the control portion 6. In this embodiment, a laser interferometer is employed. Similarly, the change in height of the region or position on which the electron beam 19 is irradiated is grasped in detail by real-time transferring the measurement data of the optical height measuring device 35, to the control portion 6. The displacement in the irradiation position of the electron beam and the displacement in the focal position thereof are calculated on the basis of these data, so that these positional displacements are corrected automatically by the position correct control circuit 43. Accordingly, a method of operating an electron beam accurately and exactly is secured.

By the aforementioned method of scanning the electron beam 19, the electron beam is irradiated onto the whole surface of the semiconductor wafer 9 which is the sample or onto a preliminarily set inspection region, so that secondary electrons 51 are generated by the aforementioned principle and secondary electrons 51 and 52 are detected by the aforementioned method. A good-quality image can be obtained by the configuration and operation of the respective parts. For example, not only about a 20-fold secondary electron multiplying effect can be obtained by irradiating secondary electrons onto the reflection plate 17 by the aforementioned configuration and method but also the influence of aberration on the primary electron beam can be suppressed compared with the conventional method. Further, second secondary electrons 52 obtained by irradiating reflected electrons generated from a surface of the semiconductor wafer 9 onto the reflection plate 17 in the same manner as in the secondary electrons can be detected easily by adjusting the electro-magnetic field applied to the E×B deflector in the same configuration. Further, secondary electrons can be detected efficiently even in different irradiation conditions corresponding to samples by controlling the electric field and magnetic field of the E×B deflector 18 so as to be interlocked with the negative high voltage applied to each sample. Further, by the method of detecting secondary electrons by using the semiconductor detector 20, digitizing the detected image signal just after the detection and optically transmitting the digital signal, the influence of noise generated in various conversion and transmission is reduced so that high SN image signal data can be obtained. In a process in which an electron-beam image is formed on the basis of the detected signal, the image processing portion 5 makes the first or second storage portion 46 or 47 store sequentially a signal detected in a time corresponding to a desired pixel in the electron beam irradiation position designated by the control portion 6 as a brightness gradation value corresponding to the signal level of the detected signal. By relating the electron beam irradiation position to the quantity of secondary electrons related to the detection time, an electron-beam image of the circuit pattern in the sample is formed two-dimensionally. In this manner, a high-accurate, high-SN-ratio and good-quality electron-beam image can be made to be acquired. Although the above description of this embodiment has been made about the inspection method and apparatus in which secondary electrons generated from the sample are detected, not only the secondary electrons but also backward scattered electrons and reflected electrons are generated from the sample. These secondary charged particles as well as the secondary electrons can be detected as an electron-beam image signal in the same manner as described above.

When the image signal is transferred to the image processing portion 5, the electron-beam image of the first region is stored in the first storage portion 46. The arithmetic operation portion 48 carries out various kinds of image processing for position alignment of the stored image signal with an image signal in the other storage portion, standardization of signal level and removal of a noise signal. Successively, while the electron-beam image of the second region is stored in the second storage portion 47 and the same arithmetic operation processing as described above is applied thereto, there is carried out an arithmetic operation based on comparison between the electron-beam image of the second region and an image signal in one and the same circuit pattern and one and the same position in the first electron-beam image. The defect judgment portion 49 compares the absolute value of the differential image signal obtained by the comparison and arithmetic operation in the arithmetic operation portion 48 with a predetermined threshold. When the level of the differential image signal is larger than the predetermined threshold, the defect judgment portion 49 judges the pixel as a candidate for a defect and displays the position thereof, the number of defects, etc. on the monitor 50. While the electron-beam image of the third region is then stored in the first storage portion 46 and the same arithmetic operation is applied thereto, the electron-beam image is compared with the electron-beam image of the second region previously stored in the second storage portion 47 to thereby judge a defect. Thereafter, this operation is repeated so that image processing is executed upon all the detection regions.

By the aforementioned inspection method, a micro defect generated on a micro circuit pattern can be detected in a practically effective inspection time by acquiring a high-accurate good-quality electron-beam image and performing comparison and inspection. Further, a pattern formed from a silicon oxide film or a resist film and foreign matter or defects in these materials can be detected by acquiring an image by use of an electron beam though inspection cannot be performed by the optical pattern inspection method because light is transmitted. Further, inspection can be performed stably even in the case where the material forming the circuit pattern is an electrically insulating material.

Embodiment 2

Figure 6:
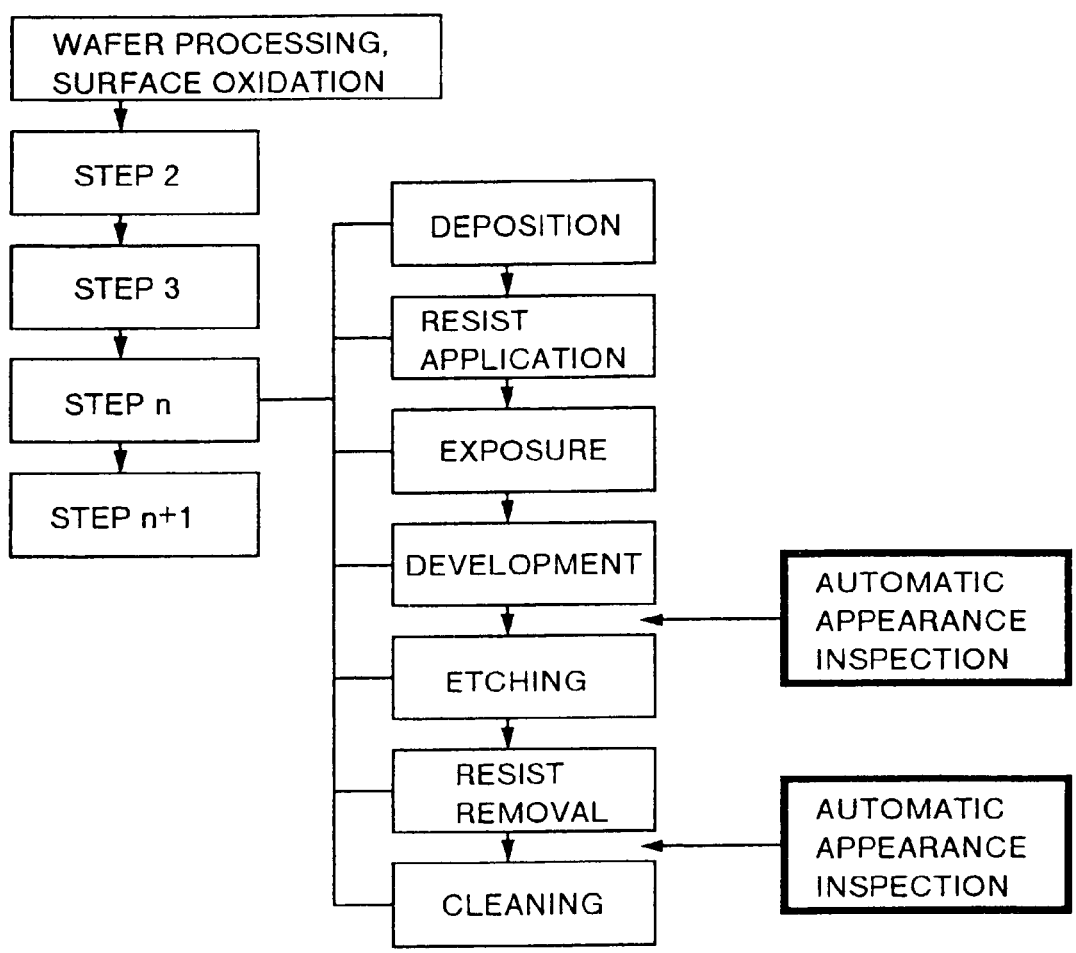
FIG. 6 is a view for explaining a flow of a semiconductor device producing process.
Figure 7A:
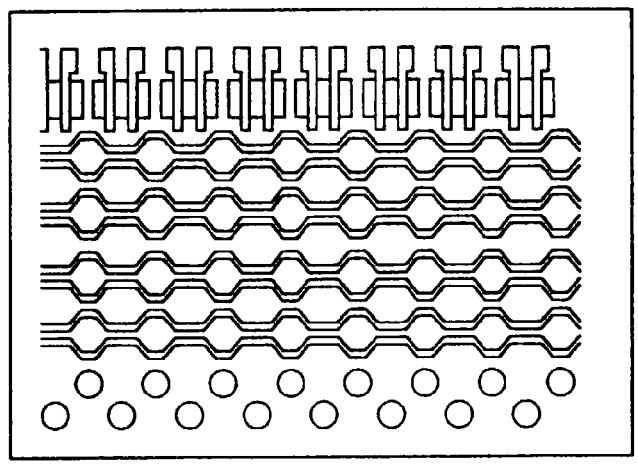
FIGS. 7(a) and 7(b) are views for explaining a semiconductor device circuit pattern and a content of defect.
Figure 7B:
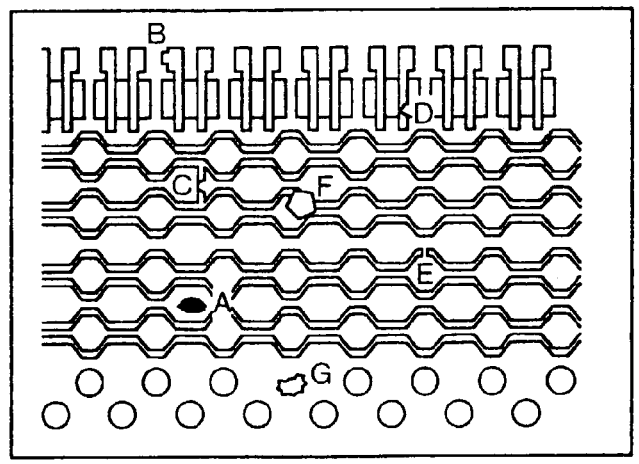

In this embodiment, there will be described an applied example in which a semiconductor wafer is inspected by using the circuit pattern inspection apparatus 1 and method according to the present invention. FIG. 6 shows a process for producing a semiconductor device. As shown in FIG. 6, a large number of pattern forming processes are repeated in the semiconductor device. The pattern forming process is roughly constituted by the steps of deposition, application of a light-sensitive resist, exposure, development, etching, resist removal and cleaning. If the production condition for processing is not optimized in each step, a circuit pattern of the semiconductor device formed on the substrate is not formed normally. FIGS. 7(*a*) and 7(*b*) schematically show a circuit pattern formed on a semiconductor wafer in a production process. FIG. 7(*a*) shows a circuit pattern processed normally, and FIG. 7(*b*) shows a circuit pattern in which a failure in processing occurs. When, for example, abnormality occurs in the step of deposition in FIG. 6, particles are generated and deposited on a surface of the semiconductor wafer so that an isolated defect, or the like, is formed as shown in FIG. 7(*b*). Further, if the condition for the focal point, exposure time, etc. of an exposure device for performing exposure at the time of exposure is not optimized, a region of the resist in which the quantity or intensity of light to be irradiated is too large or a region of the resist in which the quantity or intensity of light to be irradiated is too small is generated to thereby bring short-circuiting, breaking and pattern tapering as shown in FIG. 7(*b*). When there is some defect in a mask/reticle at the time of exposure, the same abnormality in pattern shape occurs in one and the same region correspondingly to a shot which is the unit of exposure. Further, short-circuiting or a projection, an isolated defect, a failure in opening, etc. are generated because of a thin film or particles generated in the case where the quantity of etching is not optimized and in the middle of etching. At the time of cleaning, micro particles are generated by re-deposition of stain of a cleaning layer and of film and particles peeled so that irregularity in thickness of oxide film is apt to occur in its surface correspondingly to the dewatering condition at the time of drying.

Accordingly, by applying the circuit pattern inspection method and apparatus 1 of Embodiment 1 to a semiconductor device producing process, the occurrence of abnormality can be detected with a high accuracy in an early stage so that a measure counter to abnormality can be given to the process and that the processing condition can be optimized to prevent the occurrence of these failures. When, for example, a defect or break in a photo resist pattern is detected by execution of a circuit pattern inspection process after a development process, the situation in which the exposure condition and focal point condition for the exposure device in the exposure process are not optimized is inferred, and these conditions are improved immediately by adjustment, or the like, of the focal point condition or the quantity of exposure. Further, by judging from a defect distribution whether these defects occur in common to respective shots or not, defects in the photo mask reticle used in pattern forming are inferred so that inspection or exchange of the photo mask/reticle is carried out quickly. The same thing is applied to other processes, and various kinds of defects are detected by applying the circuit pattern inspection method and apparatus according to the present invention and carrying out the inspection process so that the cause of abnormality in each producing process is inferred from the content of the detected defect.

Because the change of various producing conditions and the occurrence of abnormality can be detected in a real inspection time by carrying out the circuit pattern inspection method and apparatus 1 in the semiconductor device producing process in line, the occurrence of a large quantity of failures can be prevented. Further, the efficiency percentage in the whole semiconductor device can be predicted on the basis of the degree of the defect, the frequency in occurrence of the defect, and so on, detected by application of the circuit pattern inspection method and apparatus, so that efficiency in production of the semiconductor device can be improved.

Embodiment 3

The third embodiment of the present invention as to the configuration of the inspection apparatus is configured in the same manner as in the first embodiment except that an objective lens 16 in the electronic optical system 3 is disposed above the secondary electron detector 20 as shown in FIG. 8. FIG. 8 shows an enlarged partial view of the inside of the inspection chamber 2 in the circuit pattern inspection apparatus. The operation based on the configuration of the third embodiment will be described below. An electron beam 19 is irradiated onto an inspection-subject substrate 9 in the same method as in the first embodiment. A negative high voltage is applied to the inspection-subject substrate 9 in the same manner as in the first embodiment. In this embodiment, the negative voltage for retarding primary electrons applied to the inspection-subject substrate 9 is selected to be −3.5 keV. By electron beam irradiation, secondary electrons 51 are generated from a surface of the sample substrate 9 by the aforementioned operation. Because the secondary electrons 51 generated from the surface of the sample substrate 9 are accelerated to 3.5 keV rapidly by the negative voltage applied to the sample substrate 9, the direction of the secondary electrons 51 generated from the surface of the substrate 9 is arranged in line. Because the spread of the accelerated secondary electrons 51 at the time of collision with the reflection plate 17 is not larger than the order of mm, detecting efficiency is not lowered even if the secondary electrons 51 are not converged by the objective lens 16. Accordingly, because second secondary electrons 52 generated by collision of the accelerated secondary electrons 51 with the reflection plate 17 can be detected as a signal with high efficiency even in the configuration of this embodiment in which the objective lens 16 is disposed in a position for converging only the primary electron beam 19, a good-quality electron-beam image can be acquired. According to this embodiment, the focal length of the objective lens 16 is elongated compared with the first embodiment and, as a result, resolution and accuracy can be maintained even in the case where the primary electron beam 19 is deflected widely compared with the first embodiment. This embodiment as to the other configuration and operation is the same as the first embodiment, and the description thereof will be omitted.

Embodiment 4

Figure 9:
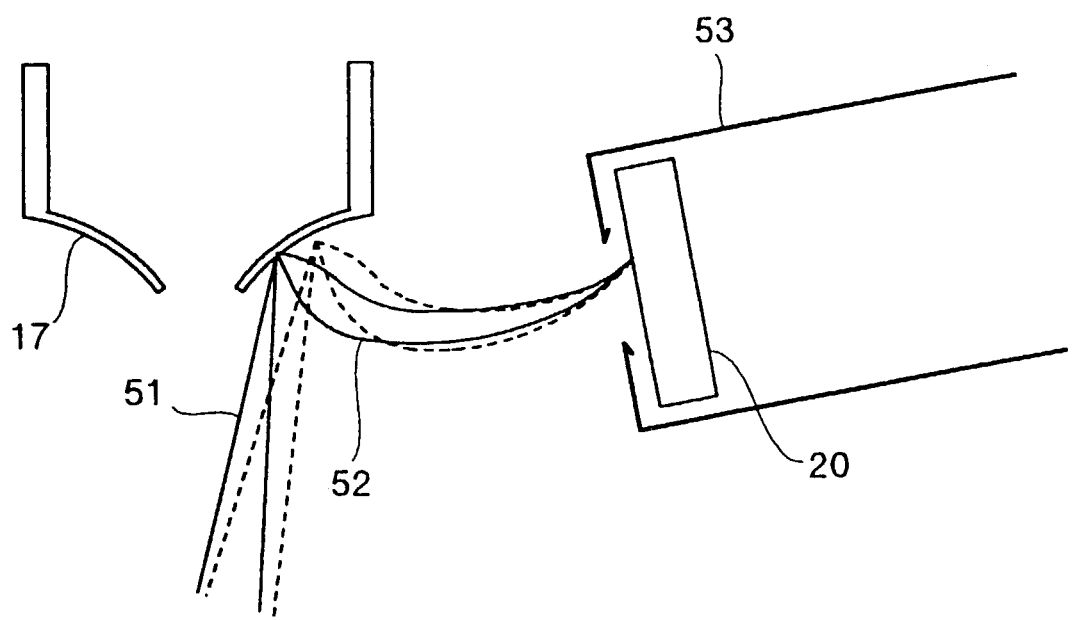
FIG. 9 is a view showing the configuration of an enlarged part of the electric optical system of a fourth embodiment.

The fourth embodiment is configured in the same manner as in the first embodiment except that the reflection plate 17 is curved. FIG. 9 shows an enlarged portion view showing the configuration of the reflection plate portion. In this embodiment, because the reflection plate 17 united with the shield pipe is curved, the angle of generation of second secondary electrons 52 is changed correspondingly to the position of the reflection plate 17 when secondary electrons 51 generated from a surface of the sample substrate 9 by irradiating an electron beam 19 onto the sample substrate 9 are accelerated by the negative high voltage applied to the sample substrate 9, deflected by the E×B deflector 18 and irradiated onto the reflection plate 17. As a result, second secondary electrons 52 generated by collision with any region of the reflection plate 17 are made easy to be grasped by the semiconductor detector 20. Accordingly, because not only the range for selecting the angle of deflection of secondary electrons 51 is widened when the accelerated secondary electrons 51 are deflected by the E×B deflector 18 but also a signal can be detected with high efficiency even in the case where the angle of generation of the secondary electrons 51 generated from the surface of the sample substrate 9 is widened, a good-quality electron-beam image can be obtained. This embodiment as to the other configuration and operation is the same as the first embodiment, and the description thereof will be omitted.

Embodiment 5

The fifth embodiment will be described below as to the configuration of the method and apparatus in which the inspection-subject substrate is electrically charged by irradiating a second charged particle beam onto the sample substrate so that inspection is performed after the potential of a member forming a circuit pattern in the inspection-subject substrate becomes stable.

Figure 10:
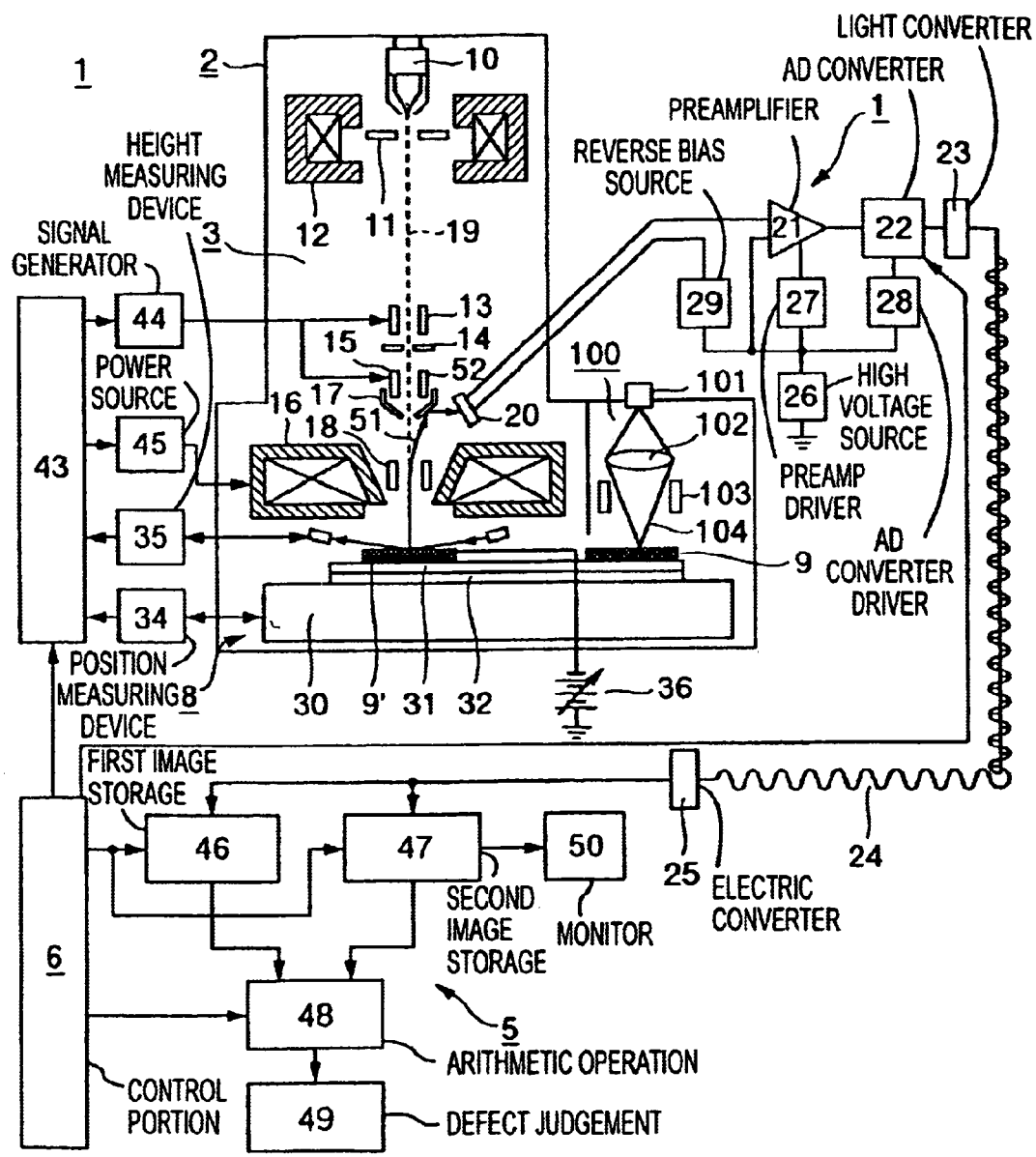
FIG. 10 is a view showing the configuration of the circuit pattern inspection apparatus of a fifth embodiment.

FIG. 10 shows the configuration of the circuit pattern inspection apparatus 1 according to the fifth embodiment. The circuit pattern inspection apparatus 1 comprises an inspection chamber 2 evacuated, a first sub chamber (not shown in this embodiment) for carrying a sample into the inspection chamber 2, a second sub chamber 100 for irradiating a second charged particle beam, a control portion 6, and an image processing portion 5. The first sub chamber (not shown) and the second sub chamber 100 are configured so as to be able to be evacuated independent of the inspection chamber 2. Further, the second sub chamber 100 has an electron gun 101, a lens 102, and a large angle deflection coil 103. The inside of the inspection chamber 2 is roughly constituted by an electronic optical system 3, a secondary electron detection portion 7, a sample chamber 8, and an optical microscope (not shown). The electronic optical system 3 has an electron gun 10, an electron extraction electrode 11, a condenser lens 12, a blanking deflector 13, a scanning deflector 15, an aperture 14, an objective lens 16, a reflection plate 17, and an E×B deflector 18. In the secondary electron detection portion 7, a secondary electron detector 20 is disposed above the objective lens 16 in the inspection chamber 2. The output signal of the secondary electron detector 20 is amplified by a preamplifier 21 disposed in the outside of the inspection chamber 2 and converted into digital data by an AD converter 22. The sample chamber 8 has a sample stage 30, X-Y stages 31 and 32, a rotation stage 33, a position monitoring measuring device 34, and an inspection-subject substrate height measuring device 35. The optical microscope (not shown) is disposed near the electronic optical system 3 in the inspection chamber 2 but at a distance where the microscope and the optical system are not influenced by each other. The distance between the electronic optical system 3 and the optical microscope is known. An electron-beam image or optical image taken in is displayed on a monitor 50. Instructions and conditions for operating respective portions of the apparatus are inputted/outputted through the control portion 6. Conditions such as the accelerated voltage at the time of generation of an electron beam, the electron-beam deflection width, the deflection speed, the signal fetch timing of the secondary electron detector, the moving speed of the sample stage, etc. are inputted into the control portion 6 in advance so as to be able to be set freely or selectively in accordance with the purpose. Using a position correct control circuit 43, the control portion 6 monitors positional or height displacement on the basis of signals of the position monitoring measuring device 34 and the inspection-subject substrate height measuring device 35, generates correct signals from the results of monitoring and feeds the correct signals to the objective lens electric source 45 and the scanning deflector 44 so that the electron beam 19 is always irradiated onto an correct position. The image processing portion 5 has image storage portions 46 and 47, an arithmetic operation portion 48, and a defect judgment portion 49. An electron-beam image signal detected by the secondary electron detection portion 7 is stored in the image storage portion. After various arithmetic operations are carried out, the image is compared with another adjacent electron-beam image to extract only a defect portion.

The second sub chamber 100 will be described below in detail. The electron gun 101 and the lens 102 disposed in the sub chamber 100 are disposed near the electronic optical system 3 in the inspection chamber 2 but at a distance therefrom so that the gun or the lens and the optical system are not influenced by each other. By a substrate carrying means, the inspection-subject substrate 9 is loaded into the first sub chamber (not shown) which is a sample exchange chamber. In the first sub chamber, the inspection-subject substrate is put in a sample holder and held and fixed. When the first sub chamber is then evacuated so that the degree of vacuum in the first sub chamber, that is, the sample exchange chamber, reaches a certain value, the inspection-subject substrate is carried to the second sub chamber 100 together with the sample holder. The second sub chamber 100 is evacuated in advance. In the second sub chamber 100, a sub irradiation electron beam 104 from the electron gun 101 is irradiated onto the inspection-subject substrate 9. A large-current type gun having a large light source is suitable as the electron gun 101. In this embodiment, there was used an oxide cathode in which low work function oxide used in a CRT monitor was heated by a heater to thereby emit thermoelectrons. The electron lens 102 is disposed to limit the irradiation region of the sub irradiation electron beam 104 from the electron gun 101 to a certain degree so that the diameter of the sub irradiation electron beam 104 on the inspection-subject substrate 9 can be narrowed from the order of cm to the order of mm. The large angle deflector 103 is of the type capable of being deflected in a very wide angle range as used in a CRT monitor such as a television set, or the like. For example, even in the case where the inspection-subject substrate is a semiconductor wafer having a size of 8 inches or not smaller than 12 inches, the sub irradiation electron beam 104 can be scanned on the inspection-subject substrate 9 all over the sample by the deflector 103. In this occasion, the current and the number of times for scanning and the scanning speed in the sub irradiation electron beam 104 are selected to be constant so that the quantity of irradiation of the electron beam is made uniform in terms of time and space. Further, the irradiation energy of the sub irradiation electron beam 104 in the sub chamber 100 is selected to be equal to the irradiation energy of the electron beam 19 irradiated in the inspection electronic optical system 3 in the inspection chamber 2. While the electron beam 104 is irradiated in the second sub chamber 100 as described above, another inspection-subject substrate 9' is set in the inspection chamber 2 adjacent to the second sub chamber 100 so that inspection is executed by the electron beam 19 from the electron gun 10. That is, the inspection chamber 2 and the second sub chamber 100 are configured so that the operations thereof can progress independent of each other. Because the irradiation of the sub irradiation electron beam 104 in the second sub chamber 100 can be processed in a sufficiently shorter time than the time required for inspection, the time required for inspection as a whole is little increased even in the case where the inspection-subject substrate 9 is pre-treated in the second sub chamber 100.

Figure 11A:
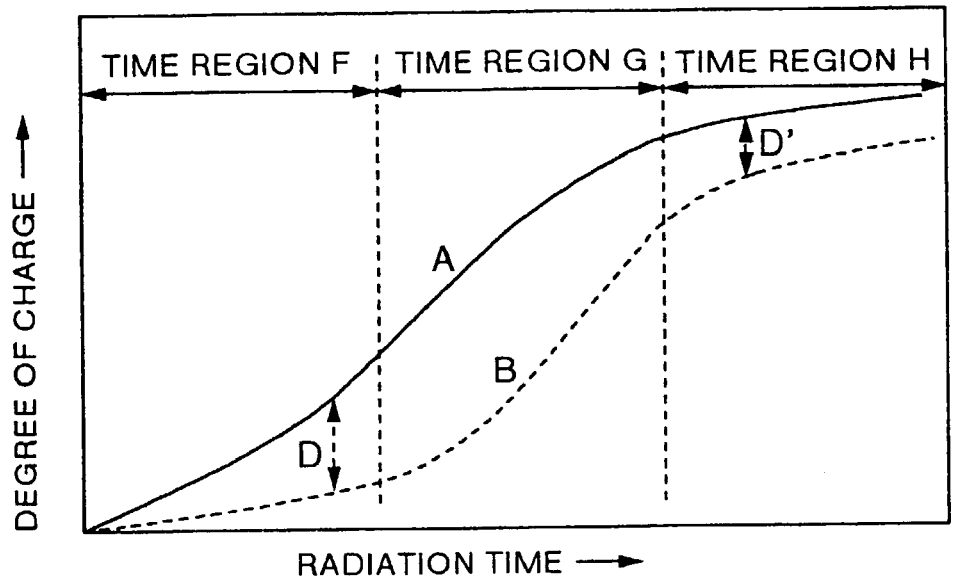
FIGS. 11(a) and 11(b) are views for explaining the influence of the electron beam irradiation time on the contrast.
Figure 11B:
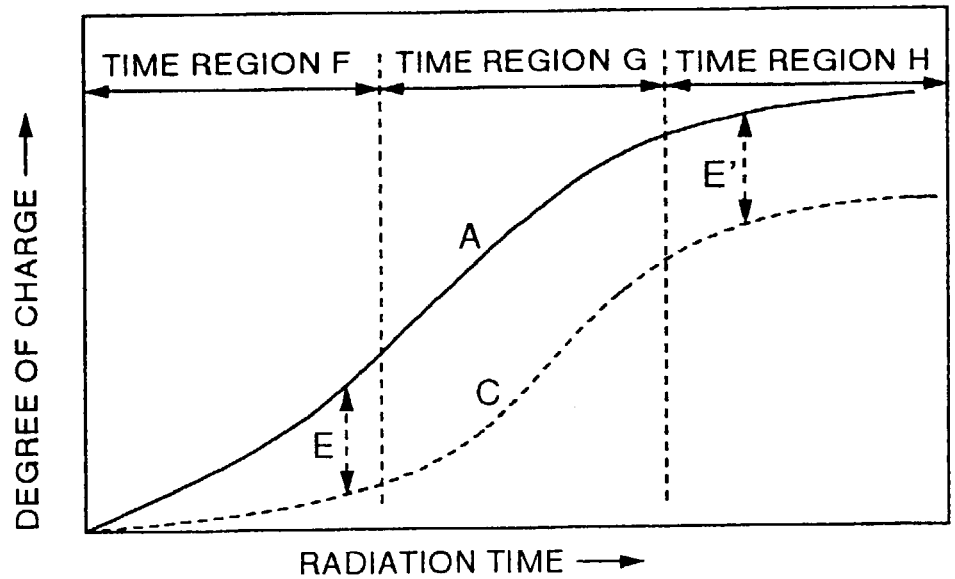

The inspection-subject substrate 9 is electrically charged by irradiating the sub electron beam 104 onto the inspection-subject substrate 9. As described above in the first embodiment, the electrically charged state of the inspection-subject substrate 9 is changed correspondingly to the time and energy of irradiation of the electron beam, so that the contrast of the resulting image is changed. FIGS. 11(a) and 11(b) show the influence of the electron beam irradiation time on the contrast. FIG. 11(a) shows the case where a photo resist (solid line A) and a wiring material (broken line B) are used as the sample shown in FIG. 4(a). FIG. 11(b) shows the case where a photo resist (solid line A) and a silicon oxide film (broken line C) are used as the sample. The change of brightness in each material is small in the region F in which the irradiation time is small. The change of brightness with the passage of time is large so as to be unstable in the time region G in which the irradiation time is relatively large. The change of brightness with the passage of time becomes small again in the time region H in which the irradiation time is large. In a combination of the two samples in FIG. 11(a), the difference in brightness between the two materials, that is, contrast D in the time region F becomes large. In a combination in FIG. 11(b), however, contrast E' in the time region H becomes large. Because the inspection of the circuit pattern is based on comparison, the larger in contrast between the sub-layer material and the surface material forming the pattern is useful for detection of a defect. It is to be understood that the irradiation time or the electrically charged state for obtaining an electron beam stable in brightness and high in contrast varies correspondingly to the combination of materials for forming the circuit pattern. Although the first embodiment has shown the case where inspection is performed in the irradiation time zone F in FIG. 11a), the inspection-subject substrate 9 can be set in the electrically charged state in the time region H in advance before inspection when the inspection-subject substrate 9 is electrically evenly charged by the irradiation of the sub irradiation electron beam 104 in this embodiment. Thereafter, an electron-beam image is acquired by the irradiation of the electron beam 19 in the inspection chamber 2 so that inspection of the circuit pattern is performed.

When the irradiation of the sub irradiation electron beam 104 in the second sub chamber 100 is completed, the inspection-subject substrate 9 together with the sample holder is put on the sample stage 30 for inspection, X-Y stages 31 and 32 and rotation stage 33 and held and fixed. This embodiment as to the inspection method after that is the same as the first embodiment, and the description thereof will be omitted. By performing inspection according to this embodiment, the electron-beam image in the optimum condition for carrying out comparison inspection, that is, brightness was made stable for every combination of materials, so that an electron-beam image large in the contrast of the member forming the circuit pattern could be obtained. Further, because a high-SN good-quality image could be obtained at a high speed by the inspection method described above in the first embodiment, a micro defect could be detected with a high accuracy and a high sensitivity without false detection of any non-defect portion even in the inspection using an electrically insulating material, or the like.

Embodiment 6

Figure 12:
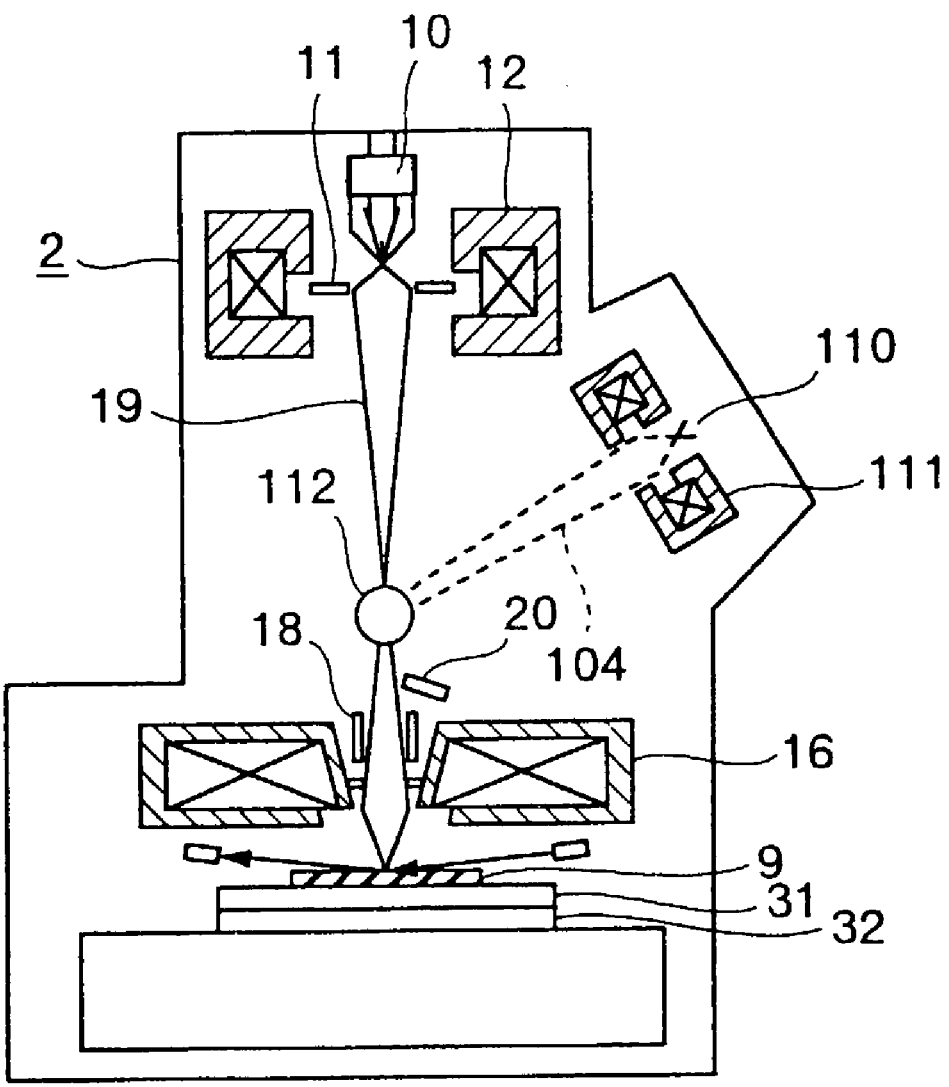
FIG. 12 is a view showing the configuration of a main part of the inspection apparatus of a sixth embodiment.
Figure 13:
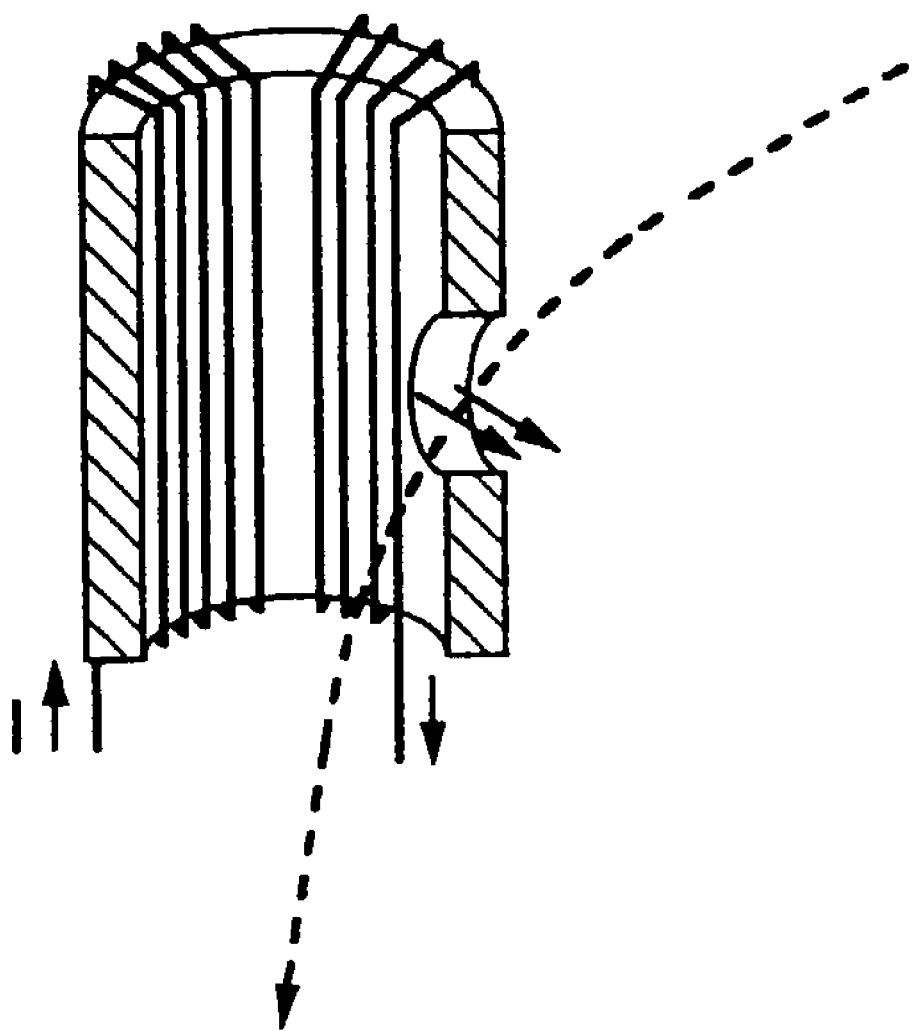
FIG. 13 is a view for explaining the principle of the deflector of the sixth embodiment.

In the sixth embodiment, the configuration and method for irradiating the sub irradiation electron beam 104 onto the inspection-subject substrate 9 without provision of the sub irradiation second sub chamber 100 described above in the fifth embodiment will be described. The basic configuration of this embodiment is the same as that of the first embodiment except that a second electron source is added to the electronic optical system 3. FIG. 12 is a main configuration view of the inspection chamber 2 in the inspection apparatus 1. As for the details of the control portion 6, the image processing portion 5, the detection system and others, reference is to be made to the first embodiment. There is a configuration in which an electron beam emitted from the second electron gun 110 is introduced in between the objective lens 16 and the condenser lens 12 in the electronic optical system 3. The potential in the second electron gun 110 is generally selected to be the same negative potential as that in the image-forming electron gun. Further, the electron beam 104 emitted from the second electron gun 110 is converged by a second condenser lens 111 and deflected toward the inspection-subject substrate 9 put on the sample stage by a deflector 112 for joining the electron beam to the optical axis of the electronic optical system. FIG. 13 shows the principle of an electromagnet type deflector as an example of the deflector 112. A coil is wound axially on a cylindrical ferromagnetic body so that a current flows in the coil. Accordingly, a circumferential-direction magnetic field is present in the ferromagnetic body. A small hole is opened in a side wall of the cylindrical ferromagnetic body and disposed so that the second electron beam enters into the small hole. Because the magnetic field in the ferromagnetic body is leaked out to a space in the small hole, the second electron beam passing through the space is deflected so as to be introduced into the optical axis of the electronic optical system. Then, the electron beam advances substantially on the same optical axis as the image-forming electron beam and is irradiated onto the inspection-subject substrate. Because the image-forming condition in the second electron beam is, however, different from that in the image-forming electron beam, the second electron beam is not focused on the inspection-subject substrate.

Figure 14A:
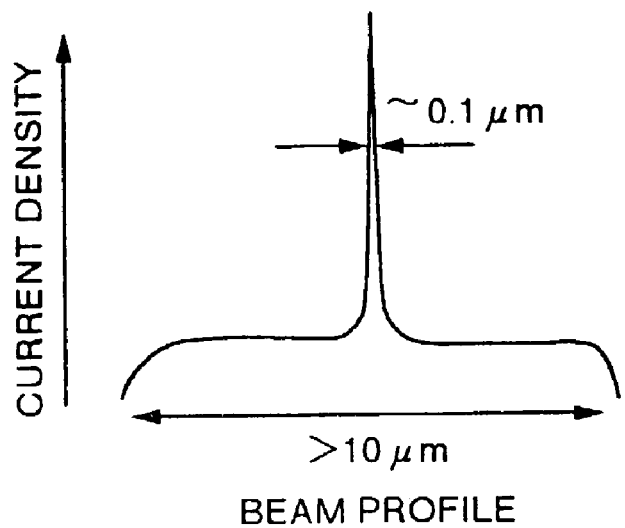
FIGS. 14(a) and 14(b) are views for explaining the shape of the electron beam of the sixth embodiment.
Figure 14B:
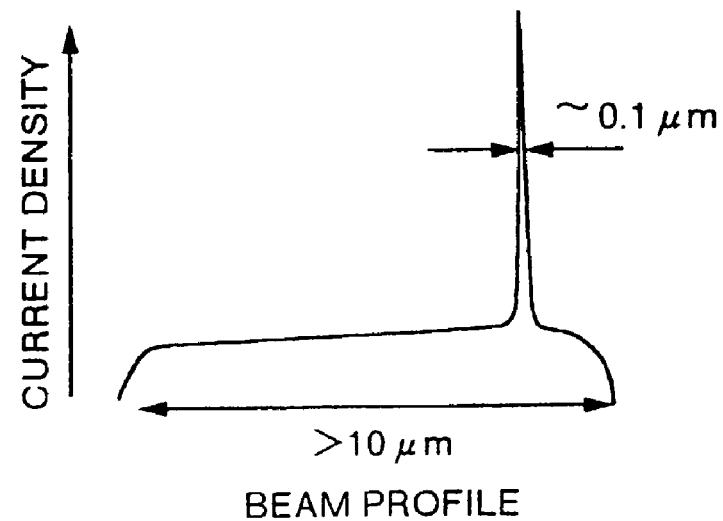

Incidentally, a method in which the sub irradiation electron beam 104 and the image-forming electron beam 19 advancing substantially on the same optical axis are irradiated simultaneously and a inspection method in which the two electron beams are irradiated while the timing is shifted are thought of. In the case of simultaneous irradiation, a correct electron-beam image cannot be obtained generally because the secondary electrons generated by irradiation of the image-forming electron beam 19 and the secondary electrons generated by the sub irradiation electron beam 104 cannot be detected so as to be discriminated. In the case where the diameter of the sub irradiation electron beam 14 is sufficiently larger than the diameter of the image-forming electron beam 19 as shown in FIGS. 14(a) and 14(b), however, the level of the secondary electrons generated by the sub irradiation electron beam 14 becomes substantially a background signal level so that the electron-beam image to be formed is substantially formed from the image signal based on the irradiation of the image-forming electron beam 19. Therefore, the condenser lens 111 of the second electron gun 110 is adjusted so that the sub irradiation electron beam 104 is not focused on the surface of the inspection-subject substrate 9 but has a size not smaller than 10 μm. FIGS. 14(a) and 14(b) show the sectional beam profiles of the second electron beam 104 and the image-forming electron beam 19 irradiated onto the inspection-subject substrate 9. Although FIG. 14(a) shows the case where the image-forming electron beam 19 is located in the center of the electron beam from the second electron gun 110, the centers of the second electron beam and the image-forming electron beam need not be always coincident with each other as shown in FIG. 14(b). Preferably, the image-forming electron beam 19 is designed to be located with in the range of the diameter of the electron beam from the second electron gun 110. This is because to prevent such a fact that if the two electron beams are at a large distance from each other, there arises the necessity of widening the operating range of the scanning deflector in order to scan the two electron beams to an inhibit area so that as a result, the inspection time is prolonged.

Further, in the case where the image-forming electron beam 19 and the electron beam 104 from the second electron gun 110 are irradiated onto the inspection-subject substrate while the timing of irradiation is shifted, the sub irradiation electron beam 104 is designed to be irradiated in a period in which the scanning of the image-forming electron beam 19 is returned. Because the image-forming electron beam 19 is raster-scanned linearly or two-dimensionally as occasion demands so that the image signal is not acquired in a period in which, for example, the electron beam is returned to the left of the image acquirement region after linear scanning of the electron beam from the left to the right, secondary electrons generated by irradiating the sub irradiation electron beam 104 in the return period have no influence on the image.

Also by the aforementioned method for irradiating an electron beam from the second electron gun 110, a good-contrast stable image can be obtained because the image is an image after the potential based on electric charge is stabilized as described above in the fifth embodiment.

Embodiment 7

Figure 15A:
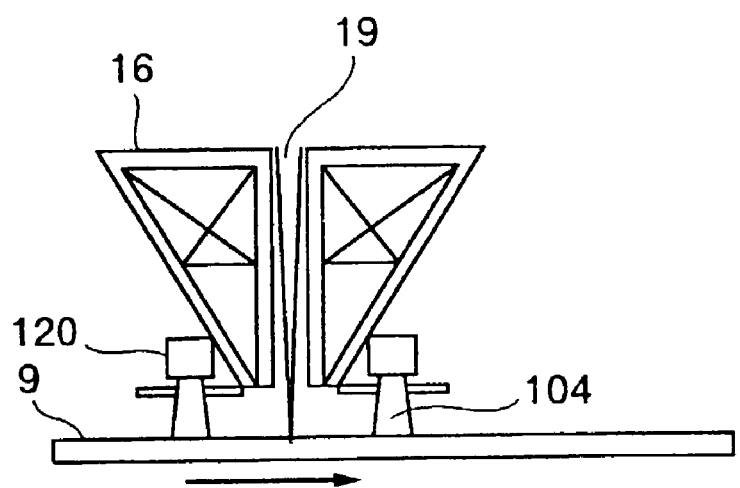
FIGS. 15(a) and 15(b) are views showing the configuration of a main part of the electronic optical system of a seventh embodiment.
Figure 15B:
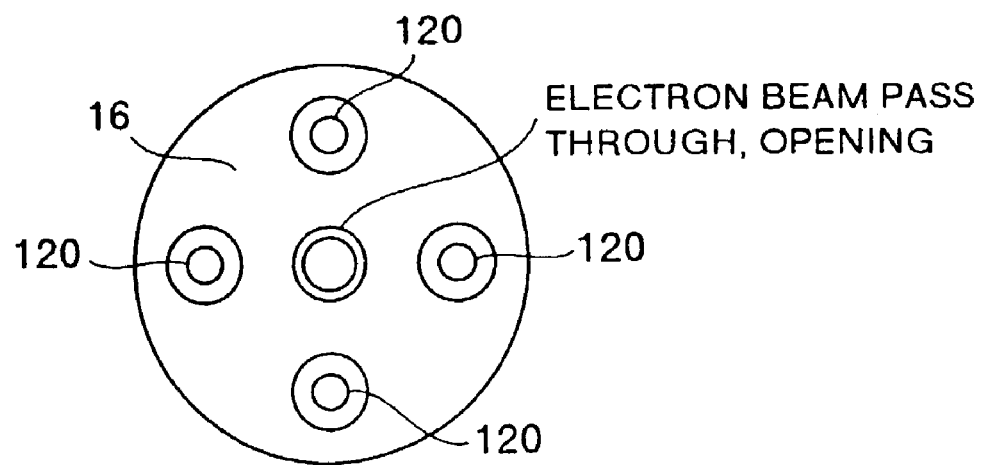

In the seventh embodiment, there will be described the configuration of the method and apparatus in which the second electron source for the sub irradiation electron beam 104 described in the sixth embodiment is provided in the peripheral portion of the aperture though which the image-forming electron beam is irradiated. FIGS. 15(a) and 15(b) show the portion of the electronic optical system in the seventh embodiment. This embodiment as to other portions is the same as in the fourth and sixth embodiments. As shown in FIG. 15(a), a front end of the objective lens 16 is shaped like a truncated cone so that an electron gun 120 for the sub irradiation electron beam 104 is disposed in a space facing the inspection-subject substrate 9. A gun having a large light source to obtain a large current is suitable as the electron gun 120. In this embodiment, there was used an oxide cathode in which low work function oxide used in a CRT monitor was heated by a heater to thereby emit thermoelectrons. The energy of irradiation of the electron beam from the second electron gun 120 onto the inspection-subject substrate 9 is selected to the same as that of the image-forming electron beam 19. Further, the electron gun 120 for the sub irradiation electron beam 104 is constituted by two or four electron guns which are disposed so as to be two-fold or four-fold symmetric with respect to the center on the axis in which the stages are continuously moved at the time of the formation of the image, the electron guns being designed so as to operate independently of each other. The arrangement of the electron guns 120 is shown in FIG. 15(*b*) which is a view when the lower surface of the objective lens 16 is seen from the side of the inspection-subject substrate 9. The plurality of electron guns 120 operate so that sub irradiation electron beams 104 are irradiated onto places just before scanning of the image-forming electron beam is performed correspondingly to the direction of the movement of the stage. When, for example, the stage is moved from left to right as shown in FIG. 15(*a*), the second electron gun 120 in the left of FIG. 15(*b*) operates.

Figure 16:
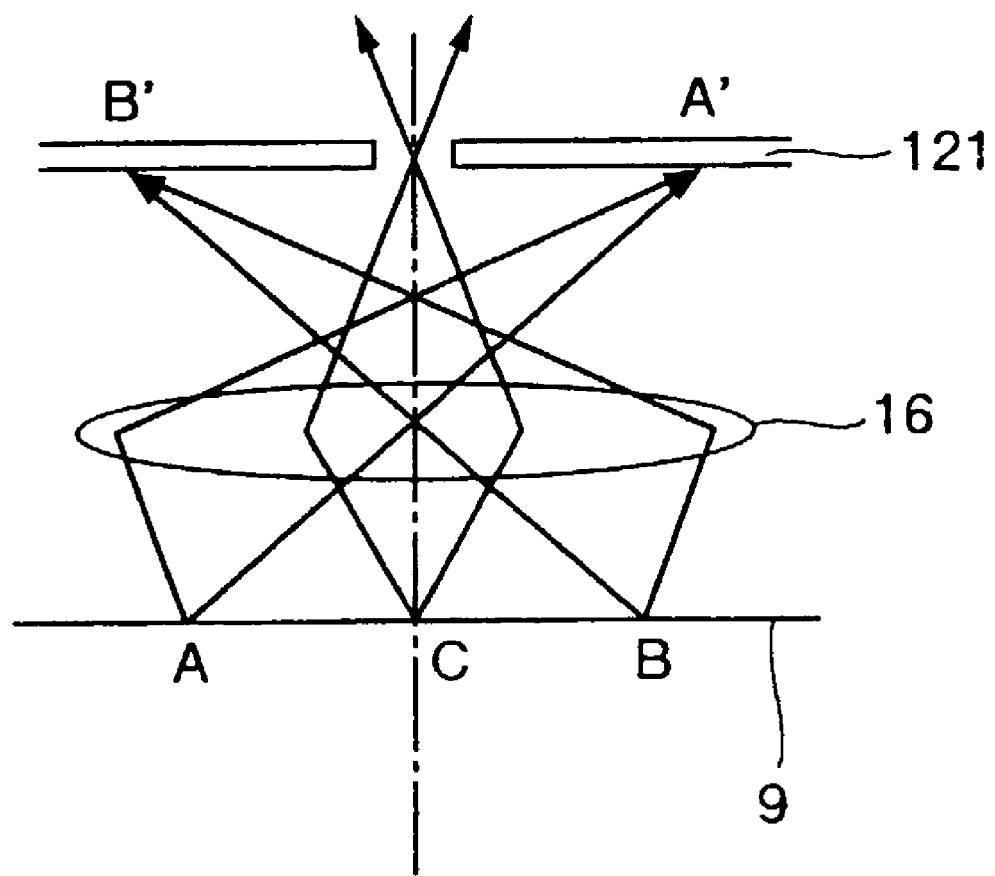
FIG. 16 is a view showing the operation of the seventh embodiment.

Further, this embodiment can be configured by the following method so that secondary electrons generated by the sub electron irradiation 104 have no bad influence on the electron-beam image even in the case where the irradiation of the sub electron beam 104 and the image-forming electron beam 19 are performed simultaneously. FIG. 16 shows a typical view of this method. Secondary electrons 51 generated from the inspection-subject substrate 9 moves up in the objective lens 16 on the basis of the acceleration electric field described above in detail in the first embodiment. In this occasion, the secondary electrons are influenced by the magnetic field in the objective lens so as to be focused. The horizontal position of this focal point varies correspondingly to the place of generation of the secondary electrons. For example, secondary electrons generated from a point A in the surface of the inspection-subject substrate are focused at A', and secondary electrons generated from a point B are focused at B'. Accordingly, by providing an aperture 121 in the focal point position of the second electrons and arranging the secondary electron detector 20 above the aperture, secondary electrons generated from the vicinity of the center of the optical axis, that is, from the place onto which the image-forming electron beam 19 is irradiated can be detected selectively. Because the position of irradiation of the sub electron beam 104 is at a distance of the order of hundreds of μm from the position of irradiation of the image-forming electron beam 19, secondary electrons generated by the sub irradiation electron beam 104 are blocked by the aperture so as not to be detected. Also in this embodiment, the same good-contrast image as in the fifth or sixth embodiment could be acquired after the sample was electrically charged in advance and the potential was stabilized.

Embodiment 8

For example, in a semiconductor device producing process, the inspection-subject substrate may have been already subjected to electron beam irradiation not only by the circuit pattern inspection apparatus according to the present invention but also by inspection, observation, or the like, using the SEM. In such a case, a local portion of a surface of the inspection-subject substrate may have been already electrically charged before execution of the circuit pattern inspection, so that it is difficult that the locally electrically charged region is electrically evenly charged so as to be equal to other regions by the inspection method according to the aforementioned embodiments. Accordingly, the locally electrically charged region may be unable to be inspected because a specific contrast electron-beam image is formed from the region. To avoid this situation, the electric charging of the surface is preferably neutralized before circuit pattern inspection is carried out according to the aforementioned respective embodiments.

Figure 17:
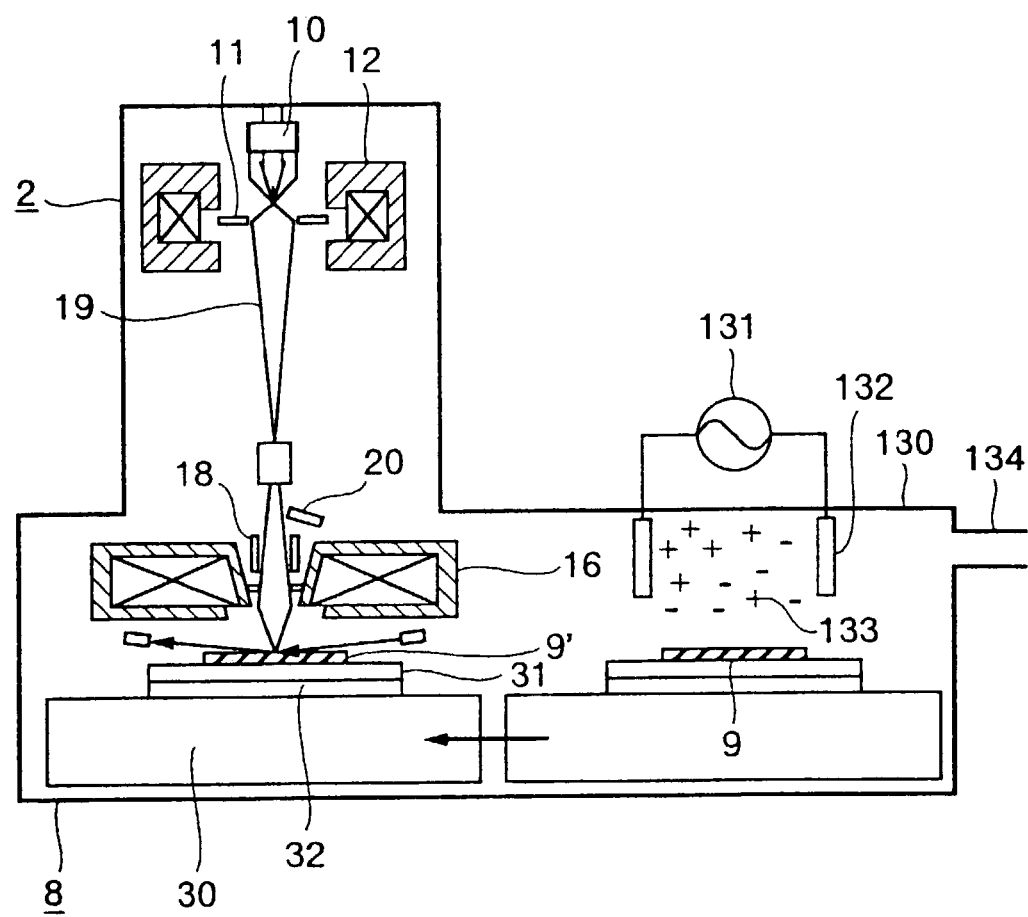
FIG. 17 is a view showing the configuration of a main part of the inspection apparatus of an eighth embodiment.

In this embodiment, a second sub chamber 130 is added to the configuration of the circuit pattern inspection apparatus 1 described in the first embodiment so that plasma is irradiated onto the inspection-subject substrate in the second sub chamber 130 before inspection. FIG. 17 shows the partial configuration of the inspection chamber 2 and the second sub chamber 130 in this embodiment.

A gas introduction inlet 131 and electrodes 132 for applying an electric field for ionizing an introduced gas are disposed in the second sub chamber 130. A high-frequency electric source 131 is connected to the electrodes 132. After the first sub chamber (not shown) is evacuated, the inspection-subject substrate 9 put in the sample holder in the first sub chamber is carried to the second sub chamber 130 already evacuated. Then, rare gases such as Ar, etc., and air having a pressure not larger than the order of Pa are introduced into the second sub chamber 130, and a high-frequency voltage is applied between the electrodes 132 so that these gases are ionized to form plasma 133. The inspection-subject substrate 9 is left in the plasma 133 for a predetermined period, so that the electrically charged portion is neutralized during the period. After this pre-treatment is carried out, the inspection-subject substrate 9 is carried into the inspection chamber 2 for performing inspection. The inspection method has been described above in detail in the first embodiment, and the description thereof will be omitted. Because the local electric charging of the inspection-subject substrate 9 is neutralized by the pre-treatment described in this embodiment just before inspection, the surface of the inspection-subject substrate 9 is electrically evenly charged when an electron-beam image is acquired by irradiating an electron beam at the time of inspection. Accordingly, because the electron-beam image used for comparison inspection becomes uniform in contrast, high-accurate and stable inspection can be performed. In a period of the irradiation of the plasma 113 in the sub chamber 130 described in this embodiment, another inspection-subject substrate 9' is set in the inspection chamber adjacent to the sub chamber 130, and inspection is performed. Because the time required for the pre-treatment using plasma irradiation is sufficiently shorter than the time required for the inspection, the inspection time as a whole is little increased by performing the pre-treatment.

Although the typical configuration of the apparatus and the circuit pattern inspection method according to the present invention have been described above by way of embodiments as to the method in which an electron-beam image is acquired at a high speed by electron beam irradiation so as to be used for comparison inspection, the method in which inspection is performed after the potential of the inspection-subject substrate is stabilized by irradiation of a second charged particle beam, the method in which secondary electrons generated from the inspection-subject substrate are detected efficiently to obtain a good-quality electron-beam image, the method in which producing efficiency in a process of producing a substrate having a circuit pattern formed from an electrically conductive or electrically non-conductive material such as a semiconductor device, a mask, a liquid crystal, etc. is improved by executing the circuit pattern inspection according to the present invention, and so on, an inspection method and an inspection apparatus obtained by any combining a plurality of characteristics described in Claims can be made without departing from the scope of the present invention.

Typical effects obtained by the preset invention will be described below in brief.

Inspection of a circuit pattern formed from a silicon oxide film or a resist film which was so light-transmissible as to be unable to be detected by conventional optical pattern inspection could be achieved by inspecting a substrate such as a semiconductor device, or the like, having a circuit pattern by using a circuit pattern inspection apparatus according to the present invention. Furthermore, a circuit pattern having an electrically insulating material from which a stable image is hardly obtained in the conventional SEM can be inspected in an inspection time which can be put into practical use in a method of producing a semiconductor device, or the like.

Because defects which cannot be detected by the convectional technique, that is, abnormality in production apparatuses, conditions, etc. can be detected in an early stage with a high accuracy by applying this inspection to a substrate producing process, a measure counter to the abnormality can be given to the substrate producing process immediately. As a result, the percentage of defects in the semiconductor device and other substrates can be reduced so that producing efficiency can be improved. Further, because the occurrence of abnormality can be detected quickly by applying the aforementioned inspection, the occurrence of a large quantity of failures can be prevented. Further, because the occurrence of failures per se can be reduced as a result, reliability of the semiconductor device, etc. can be improved so that not only efficiency in development of novel products, or the like, can be improved but also the cost for production can be reduced.

What is claimed is:

1. A circuit pattern inspection apparatus comprising:
    an electron source for generating a primary electron beam;
    a lens system for converging said primary electron beam;
    a sample table for mounting a sample thereon;
    a deflector for making said converged electron beam performs scanning on said sample on which a circuit pattern is formed;
    a power supply through which a negative voltage is applied to said sample table or said sample;
    a detector for detecting secondary charged particles generated secondarily from said sample;
    a storage circuit for forming an image on the basis of a signal from said detector and storing the thus formed image;
    a comparator circuit for comparing the image of a concerned region stored in said storage circuit with another image in another region in which another same circuit pattern is formed;
    a judgment circuit for judging a defect in said circuit pattern from a result of the comparison; and
    a control portion to which one of parameter, instruction and condition for operating arbitrary portion of the apparatus is inputted,
    wherein said control portion adjusts the respective portion of the apparatus in accordance with said inputted instruction or condition.

2. A circuit pattern inspection apparatus according to claim 1,
    wherein said control portion adjusts the negative voltage applied by the power supply in accordance with said inputted instruction or condition to retard the primary electron.

3. A circuit pattern inspection apparatus comprising according to claim 1,
    wherein said parameter or condition is including at least one selected from the group consist of quantity of electron beam, a current value of the electron beam, a scanning speed of the electron beam, the irradiation energy of the electron beam.

4. A circuit pattern inspection apparatus comprising according to claim 1,
    wherein said instruction or condition is including at least one selected from the group consist of an accelerated voltage at a time of generation of an electron beam, an electron beam deflection width, the deflection speed, the signal fetch timing of the secondary electron detector, the moving speed of the sample stage.

5. A circuit pattern apparatus comprising according to claim 1,
    wherein said instruction or condition is inputted to the control portion freely or selectively in accordance with a purpose of the inspection.

6. A circuit pattern inspection apparatus comprising:
    means for generating a primary electron beam;
    means for converging said primary electron beam;
    means for mounting a sample thereon;
    means for making said converged electron beam perform scanning on said sample on which a circuit pattern is formed;
    means for supplying a negative voltage to the sample or means for mounting the sample;
    means for detecting secondary charged particles generated secondarily from said sample;
    means for forming an image on the basis of a signal from said detector and storing the thus formed image;
    means for comparing the image of a concerned region stored in said mean for forming the image with another image in another region in which another same circuit pattern is formed;
    means for judging a defect in said pattern from a result of the comparison; and
    means for getting input one of parameter, instruction and condition for operating arbitrary portion of the apparatus,
    wherein said means for getting input adjusts the negative voltage applied by the means for supplying a negative voltage in accordance with said inputted parameter, instruction or condition to retard the primary electron.

* * * * *

UNITED STATES PATENT AND TRADEMARK OFFICE
CERTIFICATE OF CORRECTION

| | | |
|---|---|---|
| PATENT NO. | : 7,026,830 B2 | Page 1 of 1 |
| APPLICATION NO. | : 10/379555 | |
| DATED | : April 11, 2006 | |
| INVENTOR(S) | : H. Shinada et al. | |

It is certified that error appears in the above-identified patent and that said Letters Patent is hereby corrected as shown below:

On the title page: Item 63, should read Related U.S. Application Data as follows:

"Continuation of application no. 09/983,703, filed on Oct. 25, 2001, now Pat. No. 6,559,663, which is a continuation of application no. 09/525,341, filed on Mar. 14, 2000, now Pat. No. 6,329,826, which is a continuation of application no. 08/811,511, filed on --Mar. 4, 1997--, now Pat. No. 6,172,363.".

Signed and Sealed this

Eighth Day of August, 2006

JON W. DUDAS
*Director of the United States Patent and Trademark Office*